United States Patent
Yang et al.

(10) Patent No.: US 8,278,411 B2
(45) Date of Patent: Oct. 2, 2012

(54) POLYMER AND ORGANIC LIGHT-EMITTING DEVICE INCLUDING THE SAME

(75) Inventors: Hye-yeon Yang, Seoul (KR); Won-jae Joo, Seongnam-si (KR); Jhun-mo Son, Yongin-si (KR); Ho-suk Kang, Seoul (KR)

(73) Assignee: Samsung Electronics Co., Ltd. (KR)

( * ) Notice: Subject to any disclaimer, the term of this patent is extended or adjusted under 35 U.S.C. 154(b) by 176 days.

(21) Appl. No.: 12/904,500

(22) Filed: Oct. 14, 2010

(65) Prior Publication Data

US 2011/0156576 A1    Jun. 30, 2011

(30) Foreign Application Priority Data

Dec. 24, 2009    (KR) ........................ 10-2009-0131295

(51) Int. Cl.
    *C08G 73/06*      (2006.01)
(52) U.S. Cl. .......................... 528/423; 313/504; 428/917
(58) Field of Classification Search .................. 528/423; 428/917; 313/504
See application file for complete search history.

(56) References Cited

U.S. PATENT DOCUMENTS

| | | | |
|---|---|---|---|
| 5,747,205 A | 5/1998 | Hu et al. | |
| 5,891,587 A * | 4/1999 | Hu et al. | ........................ 428/690 |

FOREIGN PATENT DOCUMENTS

| | | |
|---|---|---|
| JP | 1998-312703 A | 2/1998 |
| JP | 2008-300503 A | 5/2008 |
| JP | 2009-010364 A | 5/2008 |

* cited by examiner

Primary Examiner — Shane Fang
(74) Attorney, Agent, or Firm — Cantor Colburn LLP

(57) ABSTRACT

A polymer and an organic light-emitting device including the same, wherein the polymer has a polymeric unit represented by Formula 1 below:

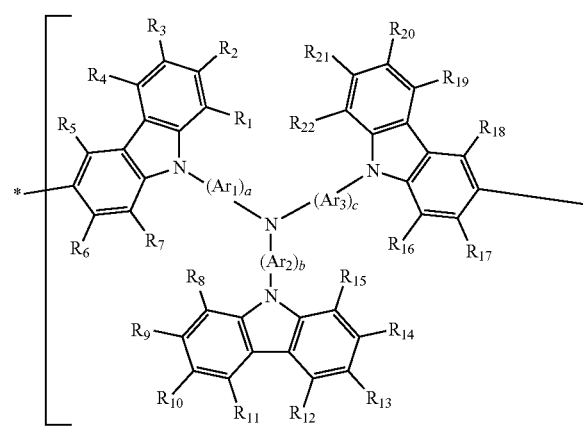

Formula 1

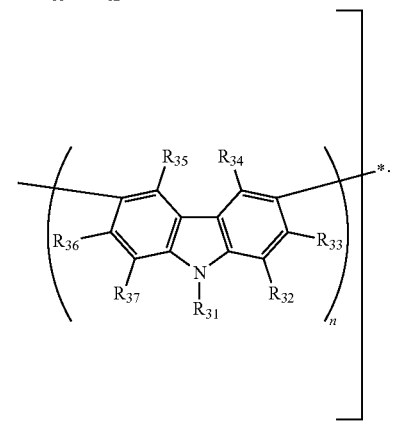

20 Claims, 7 Drawing Sheets

POLYMER AND ORGANIC LIGHT-EMITTING DEVICE INCLUDING THE SAME

CROSS-REFERENCE TO RELATED APPLICATIONS

This application claims the benefit of Korean Patent Application No. 10-2000-0131295, filed on Dec. 24, 2009, and all the benefits accruing therefrom under 35 U.S.C. §119, the content of which in its entirety is herein incorporated by reference.

BACKGROUND

1. Field

The present disclosure relates to a polymer and an organic light-emitting device including the polymer.

2. Description of the Related Art

Organic light-emitting devices include a pair of electrodes and an organic layer interposed between the electrodes, such that when a current is supplied to the electrodes, electrons and holes injected from the electrodes are re-combined in the organic layer, thereby emitting light. Accordingly, organic light-emitting devices are self-emitting devices. Organic light-emitting devices are lightweight, and may be easily manufactured using a relatively small number of components. In addition, organic light-emitting devices provide high-quality images and have wide viewing angles. Furthermore, organic light-emitting devices provide high color purity, accurately realize moving pictures, have low power consumption and are operated at low voltage. Due to these characteristics, organic light-emitting devices are suitable for mobile electronic devices.

A typical organic light-emitting device has a structure including a substrate, an anode, organic layers and a cathode, which are sequentially stacked on the substrate, wherein the organic layers include a hole transport layer ("HTL"), an emission layer ("EML") and an electron transport layer ("ETL").

When a current is applied to the anode and the cathode, holes injected from the anode move to the EML via the HTL, and electrons injected from the cathode move to the EML via the ETL. The holes and electrons recombine in the EML to generate excitons. The excitons radioactively decay to emit light having a wavelength corresponding to the band gap of a material.

Materials used to form organic layers may be classified as either vacuum-depositable materials or solution-coatable materials according to the method used to form the organic layer. Solution-coatable materials should be miscible with a solvent to form a composition that may be coated on a substrate by a known solution coating method, such as inkjet printing, screen printing or spin coating.

SUMMARY

In certain embodiments, this disclosure provides a polymer and an organic light-emitting device ("OLED") including the polymer.

Additional aspects will be set forth in part in the description which follows and, in part, will be apparent from the description, or may be learned by practice of the presented embodiments.

According to an embodiment, a polymer comprising a polymeric unit represented by Formula 1 below is provided:

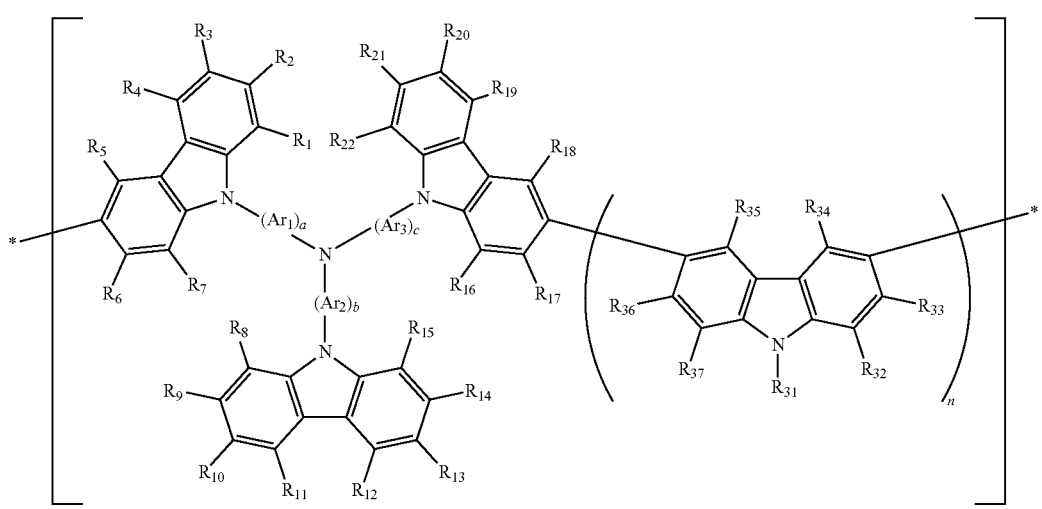

Formula 1 wherein, in Formula 1, each $Ar_1$, $Ar_2$ and $Ar_3$ is independently a substituted or unsubstituted $C_6$-$C_{30}$ arylene group or a substituted or unsubstituted 3- to 30-membered heteroarylene group;

a, b and c are each independently an integer from 1 to 3;

each $Ar_1$ in —$(Ar_1)_a$— is identical to or different from any other $Ar_1$ group, each $Ar_2$ in —$(Ar_2)_b$— is identical to or different from any other $Ar_2$ group and each $Ar_3$ in —$(Ar_3)_c$— is identical to or different from any other $Ar_3$ group;

$R_1$ to $R_{22}$ and $R_{31}$ to $R_{37}$ are each independently a hydrogen atom, a halogen atom, a hydroxyl group, an amino group, a cyano group, a carboxyl group, a substituted or unsubstituted $C_1$-$C_{30}$ alkyl group, a substituted or unsubstituted $C_2$-$C_{30}$ alkenyl group, a substituted or unsubstituted $C_2$-$C_{30}$ alkynyl group, a substituted or unsubstituted $C_1$-$C_{30}$ alkoxy group, a substituted or unsubstituted $C_6$-$C_{30}$ aryl group, a substituted or unsubstituted $C_3$-$C_{30}$ heteroaryl group, a group represented by —$N(Q_1)(Q_2)$ or a group represented by —$Si(Q_3)(Q_4)(Q_5)$, wherein $Q_1$ to $Q_5$ are each independently a hydrogen atom, a halogen atom, a hydroxyl group, an amino group, a cyano group, a carboxyl group, a substituted or unsubstituted $C_1$-$C_{30}$ alkyl group, a substituted or unsubstituted $C_2$-$C_{30}$ alkenyl group, a substituted or unsubstituted $C_2$-$C_{30}$ alkynyl group, a substituted or unsubstituted $C_1$-$C_{30}$ alkoxy group, a substituted or unsubstituted $C_6$-$C_{30}$ aryl group or a substituted or unsubstituted $C_3$-$C_{30}$ heteroaryl group;

n is an integer from 0 to 5; and each "*" indicates a point of attachment to an identical or a different polymeric unit.

According to another embodiment, an OLED includes: a substrate; a first electrode; a second electrode; and a first layer disposed between the first electrode and the second electrode, the first layer including the polymer defined above.

BRIEF DESCRIPTION OF THE DRAWINGS

These and/or other aspects will become apparent and more readily appreciated from the following description of representative embodiments, taken in conjunction with the accompanying drawings of which.

DETAILED DESCRIPTION

Figure 1:
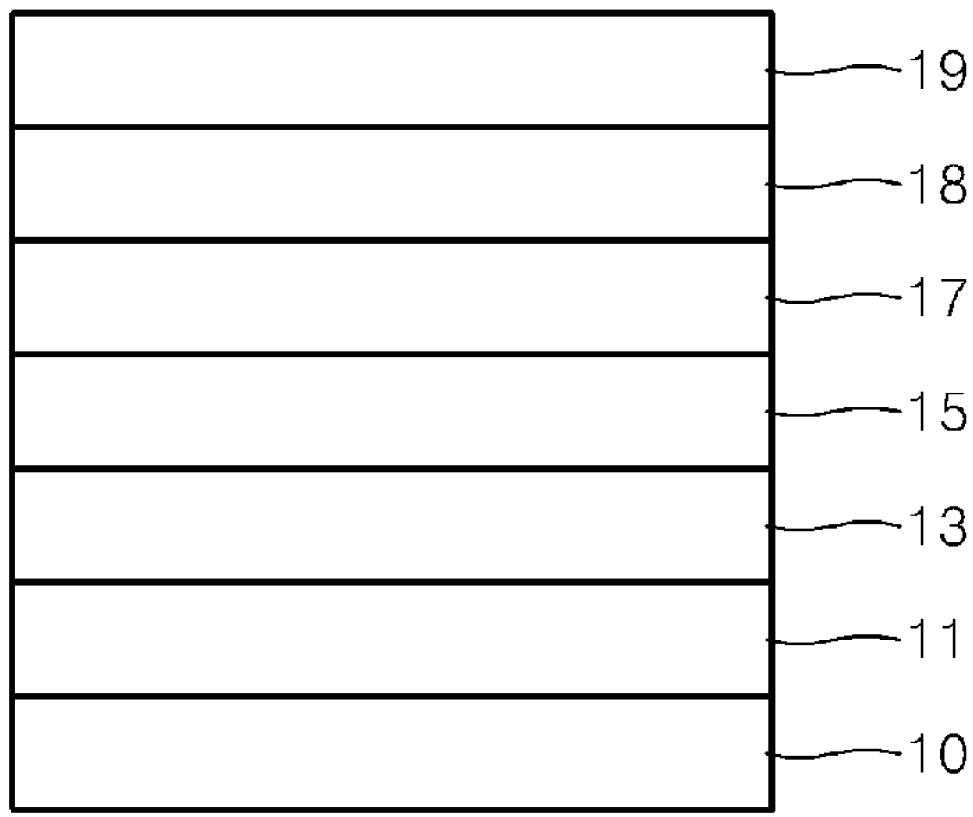
FIG. 1 is a schematic sectional view of an organic light-emitting device ("OLED") according to an embodiment.

The disclosure will be described more fully hereinafter in the following detailed description of the invention, in which some but not all embodiments of the disclosure are described. This disclosure may be embodied in many different forms and is not be construed as limited to the embodiments set forth herein; rather, these embodiments are provided so that this disclosure will be thorough and complete, and will fully convey the scope of the invention to those skilled in the art. Like reference numerals refer to like elements throughout.

In the drawings, the thickness of layers, films, panels, regions, etc., may be exaggerated for clarity.

It will be understood that, although the terms first, second, third etc. may be used herein to describe various elements, components, regions, layers and/or sections, these elements, components, regions, layers, and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present invention.

The terminology used herein is for the purpose of describing particular embodiments only and is not intended to be limiting. As used herein, the singular forms "a," "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements and/or components, but do not preclude the presence or addition of one or more other features, regions, integers, steps, operations, elements, components and/or groups thereof.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

Unless otherwise defined, all terms (including technical and scientific terms) used herein have the same meaning as commonly understood by one of ordinary skill in the art to which this invention belongs.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

As used herein, unless otherwise provided, the term "substituted" refers to a compound or radical substituted with at least one (e.g., 1, 2, 3, 4, 5, 6 or more) substituents independently chosen from a $C_1$-$C_{30}$ linear or branched alkyl, alkenyl or alkynyl group, a C6 to C18 aryl, a halogen (e.g., F, Cl, Br, I), a $C_1$-$C_{30}$ alkoxy group, a lower alkylamino group, a hydroxy group, a nitro group, a cyano group, an amino group, an amidino group, hydrazine, hydrazone, a carboxyl group, a sulfonic acid group, a phosphoric acid group or the like.

Reference will now be made in detail to embodiments, examples of which are illustrated in the accompanying drawings, wherein like reference numerals refer to the like elements throughout. In this regard, the present embodiments may have different forms and should not be construed as being limited to the descriptions set forth herein. Accordingly, the embodiments are merely described below, by referring to the figures, to explain aspects of the present description.

According to an embodiment, provided is a polymer comprising a polymeric unit represented by Formula 1 below:

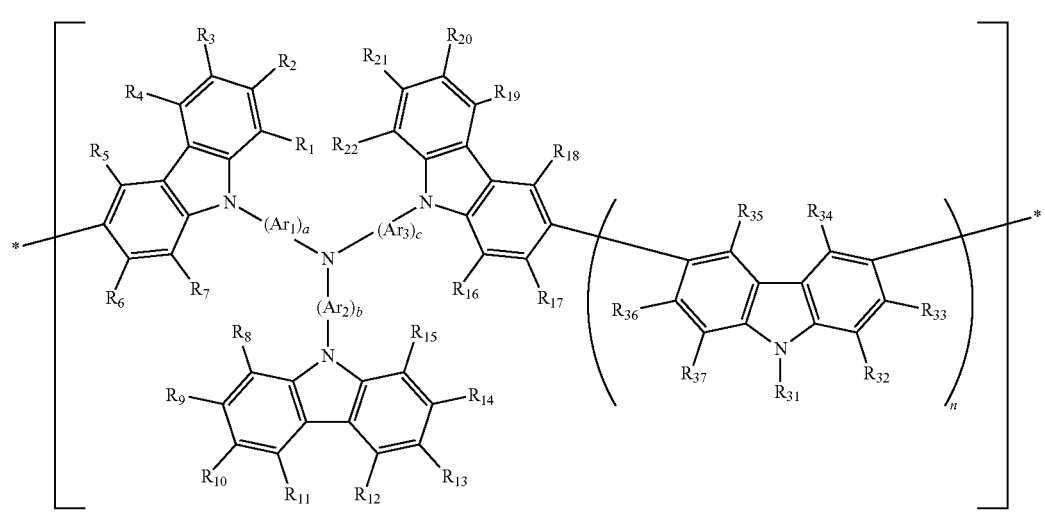

Formula 1

In certain embodiments, all polymeric units included in the polymer that satisfy Formula 1 are identical. In further embodiments, the polymer comprises from 1 to 4 different polymeric units that satisfy Formula 1. In still further embodiments, all polymeric units included in the polymer satisfy Formula 1 (i.e., the polymer consists of polymeric units of Formula 1, each of which may be identical to or different from any other polymeric unit).

In Formula 1, $Ar_1$, $Ar_2$ and $Ar_3$ are each independently a substituted or unsubstituted $C_6$-$C_{30}$ arylene group or a substituted or unsubstituted $C_3$-$C_{30}$ heteroarylene group.

For example, in certain representative embodiments, each $Ar_1$, $Ar_2$ and $Ar_3$ may be independently a substituted or unsubstituted phenylene group, a substituted or unsubstituted pentacenylene group, a substituted or unsubstituted indenylene group, a substituted or unsubstituted naphthylene group, a substituted or unsubstituted azulenylene group, a substituted or unsubstituted heptalenylene group, a substituted or unsubstituted indacenylene group, a substituted or unsubstituted acenaphthylene group, a substituted or unsubstituted fluorenylene group, a substituted or unsubstituted phenalenylene group, a substituted or unsubstituted phenanthrenylene group, a substituted or unsubstituted anthracenylene group, a substituted or unsubstituted fluoranthenylene group, a substituted or unsubstituted triphenylenylene group, a substituted or unsubstituted pyrenylenylene group, a substituted or unsubstituted chrysenylene group, a substituted or unsubstituted naphthacenylene group, a substituted or unsubstituted picenylene group, a substituted or unsubstituted perylenylene group, a substituted or unsubstituted pentaphenylene group, a substituted or unsubstituted hexacenylene group, a substituted or unsubstituted pyrrolylene group, a substituted or unsubstituted pyrazolylene group, a substituted or unsubstituted imidazolylene group, a substituted or unsubstituted imidazolinylene group, a substituted or unsubstituted imidazopyridinylene group, a substituted or unsubstituted imidazopyrimidinylene group, a substituted or unsubstituted pyridinylene group, a substituted or unsubstituted pyrazinylene group, a substituted or unsubstituted pyrimidinylene group, a substituted or unsubstituted indolylene group, a substituted or unsubstituted purinylene group, a substituted or unsubstituted quinolinylene group, a substituted or unsubstituted phthalazinylene group, a substituted or unsubstituted indolizinylene group, a substituted or unsubstituted naphthyridinylene group, a substituted or unsubstituted quinazolinylene group, a substituted or unsubstituted cinnolinylene group, a substituted or unsubstituted indazolylene group, a substituted or unsubstituted carbazolylene group, a substituted or unsubstituted phenazinylene group, a substituted or unsubstituted phenanthridinylene group, a substituted or unsubstituted pyranylene group, a substituted or unsubstituted chromenylene group, a substituted or unsubstituted benzofuranylene group, a substituted or unsubstituted thiophenylene group, a substituted or unsubstituted benzothiopheylene group, a substituted or unsubstituted isothiazolylene group, a substituted or unsubstituted benzoimidazolylene group or a substituted or unsubstituted isoxazolylene group.

In further representative embodiments, each $Ar_1$, $Ar_2$ and $Ar_3$ may be independently a substituted or unsubstituted $C_6$-$C_{14}$ arylene group or a substituted or unsubstituted 3- to 14-membered heteroarylene group, but are not limited thereto.

For example, each $Ar_1$, $Ar_2$ and $Ar_3$ may be independently a phenylene group, a $C_1$-$C_{10}$ alkylphenylene group, a di($C_1$-$C_{10}$ alkyl)phenylene group, a ($C_6$-$C_{14}$ aryl)phenylene group, a di($C_6$-$C_{14}$ aryl)phenylene group, a carbazolylene group, a $C_1$-$C_{10}$ alkylcarbazolylene group, a di($C_1$-$C_{10}$ alkyl)carbazolylene group, a $C_6$-$C_{14}$ arylcarbazolylene group, a di($C_6$-$C_{14}$ aryl)carbazolylene group, a fluorenylene group, a $C_1$-$C_{10}$ alkylfluorenylene group, a di($C_1$-$C_{10}$ alkyl)fluorenylene group, a ($C_6$-$C_{14}$ aryl)fluorenylene group, a di($C_6$-$C_{14}$ aryl) fluorenylene group, a naphthylene group, a $C_1$-$C_{10}$ alkylnaphthalene group, a di($C_1$-$C_{10}$ alkyl)naphthylene group, a ($C_6$-$C_{14}$ aryl)naphthylene group, a di($C_6$-$C_{14}$ aryl)naphthylene group, an anthrylene group, a $C_1$-$C_{10}$ alkylanthrylene group, a di($C_1$-$C_{10}$ alkyl)anthrylene group, a ($C_6$-$C_{14}$ aryl) anthrylene group, a di($C_6$-$C_{14}$ aryl)anthrylene group, a pyridinylene group, a $C_1$-$C_{10}$ alkylpyridinylene group, a di($C_1$-$C_{10}$ alkyl)pyridinylene group, a ($C_6$-$C_{14}$ aryl)pyridinylene group, a di($C_6$-$C_{14}$ aryl)pyridinylene group, a quinolinylene group, a $C_1$-$C_{10}$ alkylquinolinylene group, a di($C_1$-$C_{10}$ alkyl)quinolinylene group, a ($C_6$-$C_{14}$ aryl)quinolinylene group, a di($C_6$-$C_{14}$ aryl)quinolinylene group, a benzoimidazolylene group, a $C_1$-$C_{10}$ alkylbenzoimidazolylene group, a di($C_1$-$C_{10}$ alkyl)benzoimidazolylene group, a ($C_6$-$C_{14}$ aryl) benzoimidazolylene group, a di($C_6$-$C_{14}$ aryl)benzoimidazolylene group, an imidazopyridinylene group, a $C_1$-$C_{10}$ alkylimidazopyridinylene group, a di($C_1$-$C_{10}$ alkyl)imidazopyridinylene group, a ($C_6$-$C_{14}$ aryl)imidazopyridinylene group, a di($C_6$-$C_{14}$ aryl)imidazopyridinylene group, an imidazopyrimidinylene group, a $C_1$-$C_{10}$ alkylimidazopyrimidinylene group, a di($C_1$-$C_{10}$ alkyl) imidazopyrimidinylene group, a ($C_6$-$C_{14}$ aryl)imidazopyrimidinylene group or a di ($C_6$-$C_{14}$ aryl)imidazopyrimidinylene group, but are not limited thereto. In this regard, examples of the $C_1$-$C_{10}$ alkyl group include, but are not limited to, a methyl group, an ethyl group, a linear or branched propyl group, a linear or branched butyl group, a linear or branched pentyl group, a linear or branched hexyl group, a linear or branched heptyl group and a linear or branched octyl group. Representative examples of the $C_6$-$C_{14}$ aryl group include, but are not limited to, a phenyl group, a naphthyl group, an anthryl group and a fluorenyl group.

In Formula 1, a, b and c indicate the numbers of the respective $Ar_1$, $Ar_2$ and $Ar_3$ groups and each may be independently an integer, e.g., from 1 to 3 (i.e., 1, 2 or 3), but are not limited thereto.

In Formula 1 above, each $Ar_1$ in —$(Ar_1)_a$— may be identical to or different from any other $Ar_1$ group, each $Ar_3$ in —$(Ar_2)_b$— may be identical to or different from any other $Ar_2$ group and each $Ar_3$ in —$(Ar_3)_c$— may be identical to or different from any other $Ar_3$ group.

In certain embodiments of Formula 1 above, each of —$(Ar_1)_a$—, —$(Ar_2)_b$— and —$(Ar_3)_c$ may be independently represented by one of Formulae 2A to 2K below

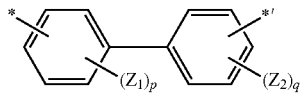

Formula 2A

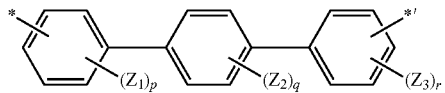

Formula 2B

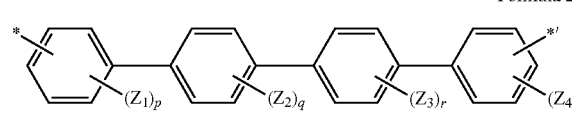

Formula 2C

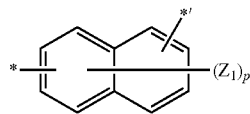

Formula 2D

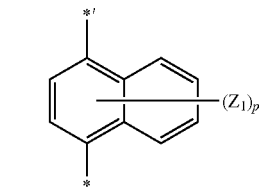

Formula 2E

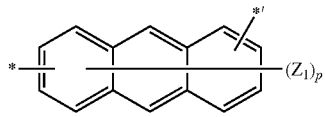

Formula 2F

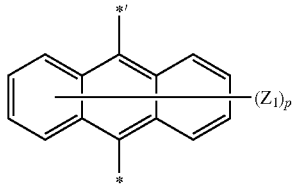

Formula 2G

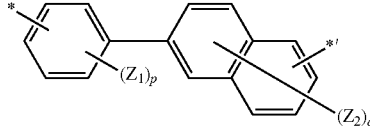

Formula 2H

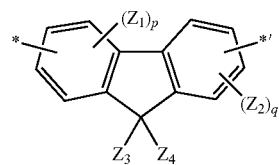

Formula 2I

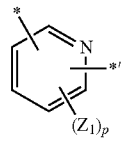

Formula 2J

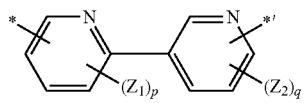

Formula 2K

In Formulae 2A to 2K above, each of $Z_1$ to $Z_4$ may be independently a hydrogen atom, a $C_1$-$C_{10}$ alkyl group (for example, a methyl group, an ethyl group, a linear or branched propyl group, a linear or branched butyl group, a linear or branched pentyl group, a linear or branched hexyl group, a linear or branched heptyl group or a linear or branched octyl group) or a $C_6$-$C_{14}$ aryl group (for example, a phenyl group, a naphthyl group or an anthryl group).

In Formulae 2A to 2K above, each of p, q, r and s may be independently an integer from 1 to 8.

In Formulae 2A to 2K above, * indicates a binding site to the central N in Formula 1 (i.e., the N that is bound to —$(Ar_1)_a$—, —$(Ar_2)_b$— and —$(Ar_3)_c$—), and *' indicates a binding site to the N of a carbazole ring in Formula 1.

In certain representative embodiments, in Formulae 2A to 2K, each of $Z_1$ to $Z_4$ may be a hydrogen atom.

In further representative embodiments of Formula 1 above, $R_1$ to $R_{22}$ and $R_{31}$ to $R_{37}$ may be independently a hydrogen atom, a halogen atom, a hydroxyl group, an amino group, a cyano group, a carboxyl group, a substituted or unsubstituted $C_1$-$C_{30}$ alkyl group, a substituted or unsubstituted $C_2$-$C_{30}$ alkenyl group, a substituted or unsubstituted $C_2$-$C_{30}$ alkynyl group, a substituted or unsubstituted $C_1$-$C_{30}$ alkoxy group, a substituted or unsubstituted $C_6$-$C_{30}$ aryl group, a substituted or unsubstituted $C_3$-$C_{30}$ heteroaryl group, a group represented by —$N(Q_1)(Q_2)$ or a group represented by —$Si(Q_3)(Q_4)(Q_5)$, wherein each of $Q_1$ to $Q_5$ may be independently a hydrogen atom, a halogen atom, a hydroxyl group, an amino group, a cyano group, a carboxyl group, a substituted or unsubstituted $C_1$-$C_{30}$ alkyl group, a substituted or unsubstituted $C_2$-$C_{30}$ alkenyl group, a substituted or unsubstituted $C_2$-$C_{30}$ alkynyl group, a substituted or unsubstituted $C_1$-$C_{30}$ alkoxy group, a substituted or unsubstituted $C_6$-$C_{30}$ aryl group or a substituted or unsubstituted $C_3$-$C_{30}$ heteroaryl group. For example, within certain embodiments, $Q_1$ to $Q_5$ may be independently a hydrogen atom, a halogen atom, a hydroxyl group, an amino group, a cyano group, a carboxyl group, a $C_1$-$C_{10}$ alkyl group, a $C_2$-$C_{10}$ alkenyl group, a $C_2$-$C_{10}$ alkynyl group, a $C_1$-$C_{10}$ alkoxy group, a $C_6$-$C_{14}$ aryl group or a 3- to 14-membered heteroaryl group, but are not limited thereto.

Within further embodiments, in Formula 1 above, each of $R_1$ to $R_{22}$ and $R_{31}$ to $R_{37}$ may be independently a hydrogen atom, a halogen atom, a hydroxyl group, an amino group, a cyano group, a carboxyl group, a substituted or unsubstituted $C_1$-$C_{10}$ alkyl group, a substituted or unsubstituted $C_2$-$C_{10}$ alkenyl group, a substituted or unsubstituted $C_2$-$C_{10}$ alkynyl group, a substituted or unsubstituted $C_1$-$C_{10}$ alkoxy group, a substituted or unsubstituted $C_6$-$C_{14}$ aryl group or a substituted or unsubstituted 3- to 14-membered $C_3$-$C_{14}$ heteroaryl group.

In certain embodiments of Formula 1 above, each of $R_1$ to $R_9$, $R_{11}$, $R_{12}$, $R_{14}$ to $R_{22}$ and $R_{32}$ to $R_{37}$ may be a hydrogen atom; and each of $R_{10}$, $R_{13}$ and $R_{31}$ may be independently a hydrogen atom, a halogen atom, a hydroxyl group, an amino group, a cyano group, a carboxyl group, a substituted or unsubstituted $C_1$-$C_{30}$ alkyl group, a substituted or unsubstituted $C_2$-$C_{30}$ alkenyl group, a substituted or unsubstituted $C_2$-$C_{30}$ alkynyl group, a substituted or unsubstituted $C_1$-$C_{30}$ alkoxy group, a substituted or unsubstituted $C_6$-$C_{30}$ aryl group, a substituted or unsubstituted 3- to 30 membered heteroaryl group, a group represented by —N($Q_1$)($Q_2$) or a group represented by —Si($Q_3$)($Q_4$)($Q_5$), wherein each of $Q_1$ to $Q_5$ may be independently a hydrogen atom, a halogen atom, a hydroxyl group, an amino group, a cyano group, a carboxyl group, a substituted or unsubstituted $C_1$-$C_{30}$ alkyl group, a substituted or unsubstituted $C_2$-$C_{30}$ alkenyl group, a substituted or unsubstituted $C_2$-$C_{30}$ alkynyl group, a substituted or unsubstituted $C_1$-$C_{30}$ alkoxy group, a substituted or unsubstituted $C_6$-$C_{30}$ aryl group or a substituted or unsubstituted 3- to 30 membered heteroaryl group.

For example, in certain embodiments of Formula 1 above, each of $R_1$ to $R_9$, $R_{11}$, $R_{12}$, $R_{14}$ to $R_{22}$ and $R_{32}$ to $R_{37}$ may be a hydrogen atom; and each of $R_{10}$, $R_{13}$ and $R_{31}$ may be independently a hydrogen atom, a halogen atom, a hydroxyl group, an amino group, a cyano group, a carboxyl group, a $C_1$-$C_{10}$ alkyl group (for example, a methyl group, an ethyl group, a linear or branched propyl group, a linear or branched butyl group, a linear or branched pentyl group, a linear or branched hexyl group, a linear or branched heptyl group, a linear or branched octyl group or the like), a $C_1$-$C_{10}$ alkoxy group (for example, a methoxy group, an ethoxy group, a linear or branched propoxy group, a linear or branched butoxy group, a linear or branched pentoxy group or the like), a $C_6$-$C_{14}$ aryl group (for example, a phenyl group, a naphthyl group, an anthryl group, a fluorenyl group or the like) or a 3- to 14-membered heteroaryl group (for example, a carbazolyl group, a pyridinyl group or the like), but are not limited thereto.

In Formula 1 above, n may be an integer from 0 to 5. For example, in Formula 1 above, n may be 0, 1 or 2, but is not limited thereto.

The polymer may comprise a polymeric unit that is represented by any one of the following Formulae 1A, 1B and 1C, but is not limited thereto:

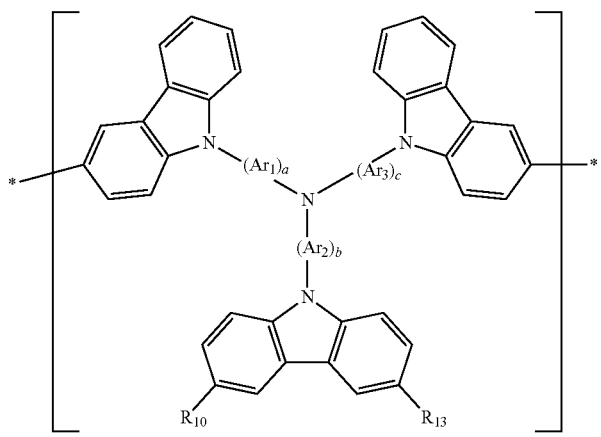

Formula 1A

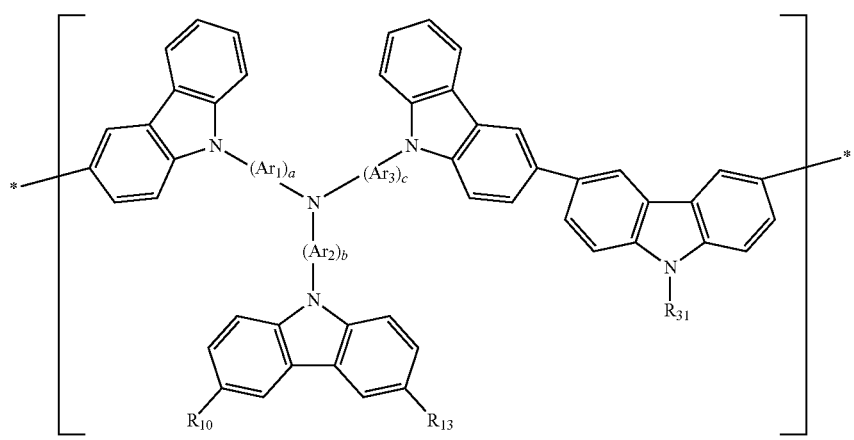

Formula 1B

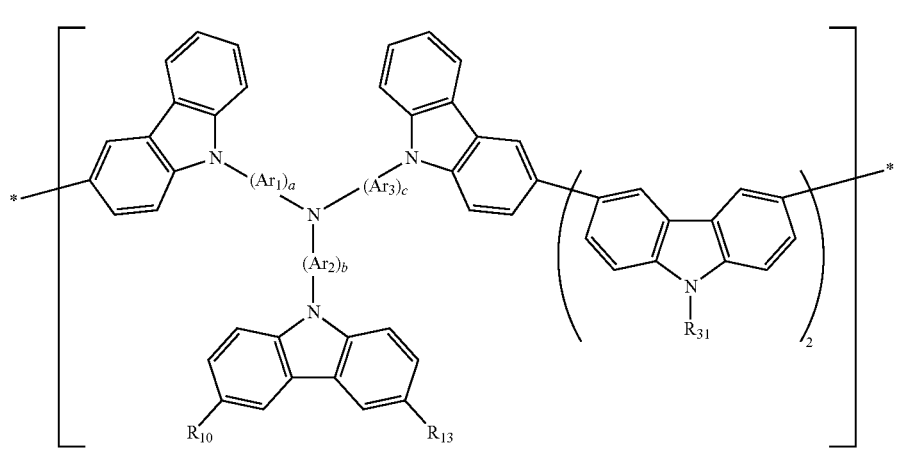

Formula 1C

In Formulae 1A to 1C, $Ar_1$ to $Ar_3$, a, b, c, —$(Ar_1)_a$—, —$(Ar_2)_b$—, —$(Ar_3)_c$—, $R_{10}$, $R_{13}$ and $R_{31}$ may be defined as described above.

In certain embodiments of Formulae 1A to 1C above, each of a, b and c may be independently 1, 2 or 3.

In further embodiments of Formulae 1A to 1C above, each of —$(Ar_1)_a$—, —$(Ar_2)_b$— and —$(Ar_3)_c$— may be independently represented by one of the Formulae 2A to 2K.

In still further embodiments of Formulae 1A to 1C above, each of $R_{10}$, $R_{13}$ and $R_{31}$ may be independently a hydrogen atom, a halogen atom, a hydroxyl group, an amino group, a cyano group, a carboxyl group, a $C_1$-$C_{10}$ alkyl group (for example, a methyl group, an ethyl group, a linear or branched propyl group, a linear or branched butyl group, a linear or branched pentyl group, a linear or branched hexyl group, a linear or branched heptyl group, a linear or branched octyl group or the like), a $C_1$-$C_{10}$ alkoxy group (for example, a methoxy group, an ethoxy group, a propoxy group, a butoxy group, a pentoxy group or the like), a $C_6$-$C_{14}$aryl group (for example, a phenyl group, a naphthyl group, an anthryl group, a fluorenyl group or the like) or a 3- to 14-membered heteroaryl group (for example, a carbazolyl group, a pyridinyl group or the like), but are not limited thereto.

In Formulae 1A to 1C above, within other embodiments, each of $R_{10}$, $R_{13}$ and $R_{31}$ may be independently a hydrogen atom, a methyl group, an ethyl group, a linear or branched propyl group, a linear or branched butyl group, a linear or branched pentyl group, a linear or branched hexyl group, a linear or branched heptyl group or a linear or branched octyl group, but are not limited thereto.

In certain embodiments of Formulae 1A to 1C above, each of —$(Ar_1)_a$—, —$(Ar_2)_b$— and —$(Ar_3)_c$— may be independently represented by Formula 2A above and each of $R_{10}$, $R_{13}$ and $R_{31}$ may be independently a methyl group, an ethyl group, a linear or branched propyl group, a linear or branched butyl group, a linear or branched pentyl group, a linear or branched hexyl group, a linear or branched heptyl group or a linear or branched octyl group.

Within further embodiments, the polymer may comprise polymeric units that are represented by one or more of Formulae 1A-1, 1B-1 and 1C-1 below.

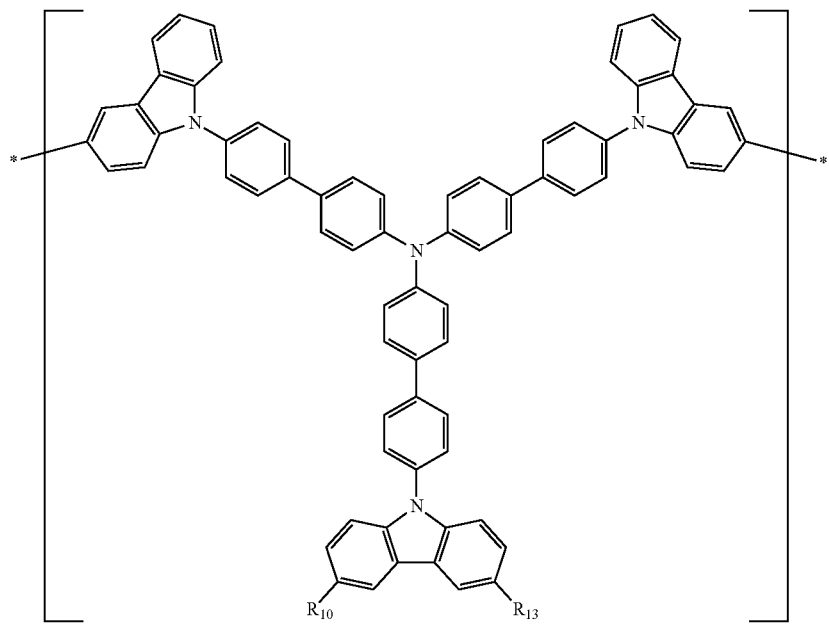
Formula 1A-1
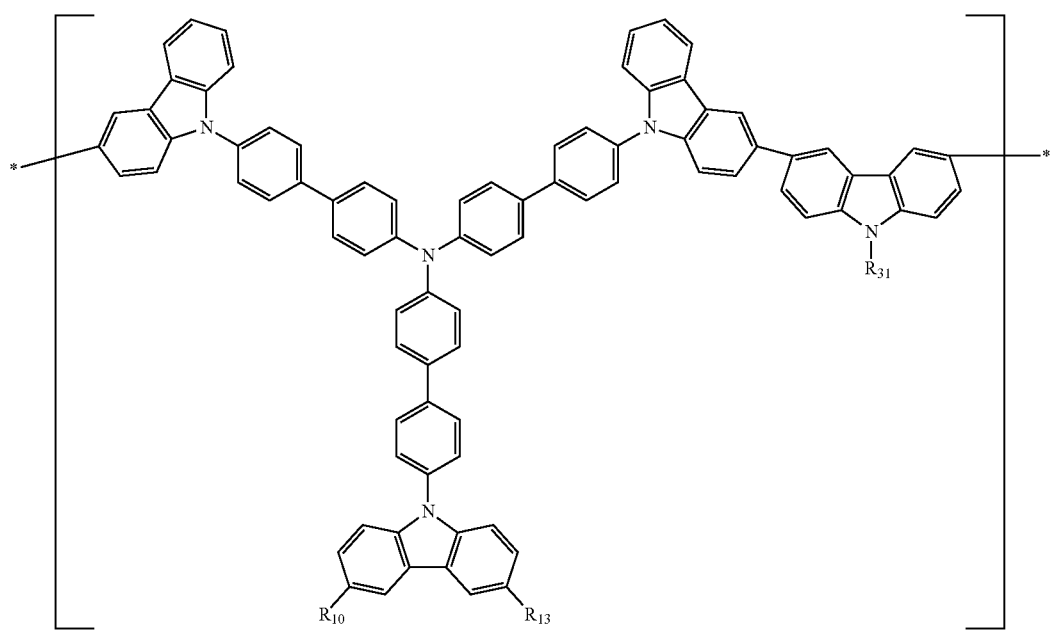
Formula 1B-1

-continued

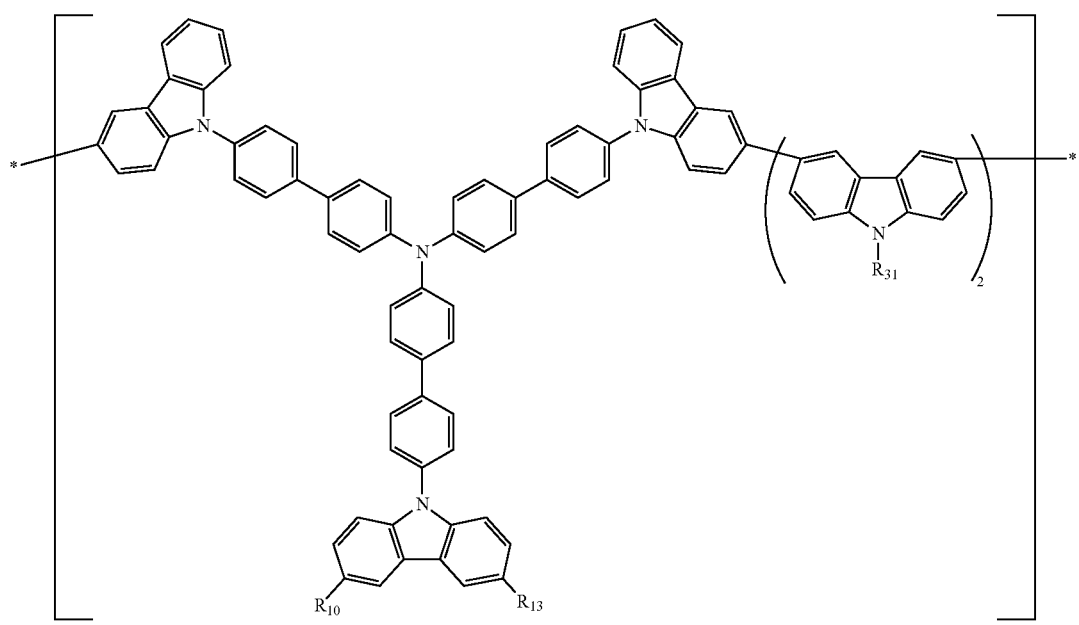

Formula 1C-1

In Formulae 1A-1, 1B-1 and 1C-1 above, each of $R_{10}$, $R_{13}$ and $R_{31}$ may be independently a hydrogen atom, a methyl group, an ethyl group, a linear or branched propyl group, a linear or branched butyl group, a linear or branched pentyl group, a linear or branched hexyl group, a linear or branched heptyl group or a linear or branched octyl group, but are not limited thereto.

A weight average molecular weight of the polymer comprising a polymeric unit of Formula 1 may be in the range of, for example, about 2,000 to about 1,000,000 on the basis of polystyrene, and a polydispersity index ("PDI") thereof may be in the range of, for example, about 1.5 to about 5. The weight average molecular weight and the PDI, which may be obtained, for example, by gel permeation chromatography ("GPC") on the basis of polystyrene calibration, may be selected based on consideration of, for example, a structure and desired characteristics of an OLED to be manufactured using the polymer.

The polymer comprising a polymeric unit of Formula 1 may have both hole and electron transport characteristics in its molecular structure. In Formula 1-1 below, two of the repeating units, which are collectively represented in "[ ]" in Formula 1, appear to be consecutively connected:

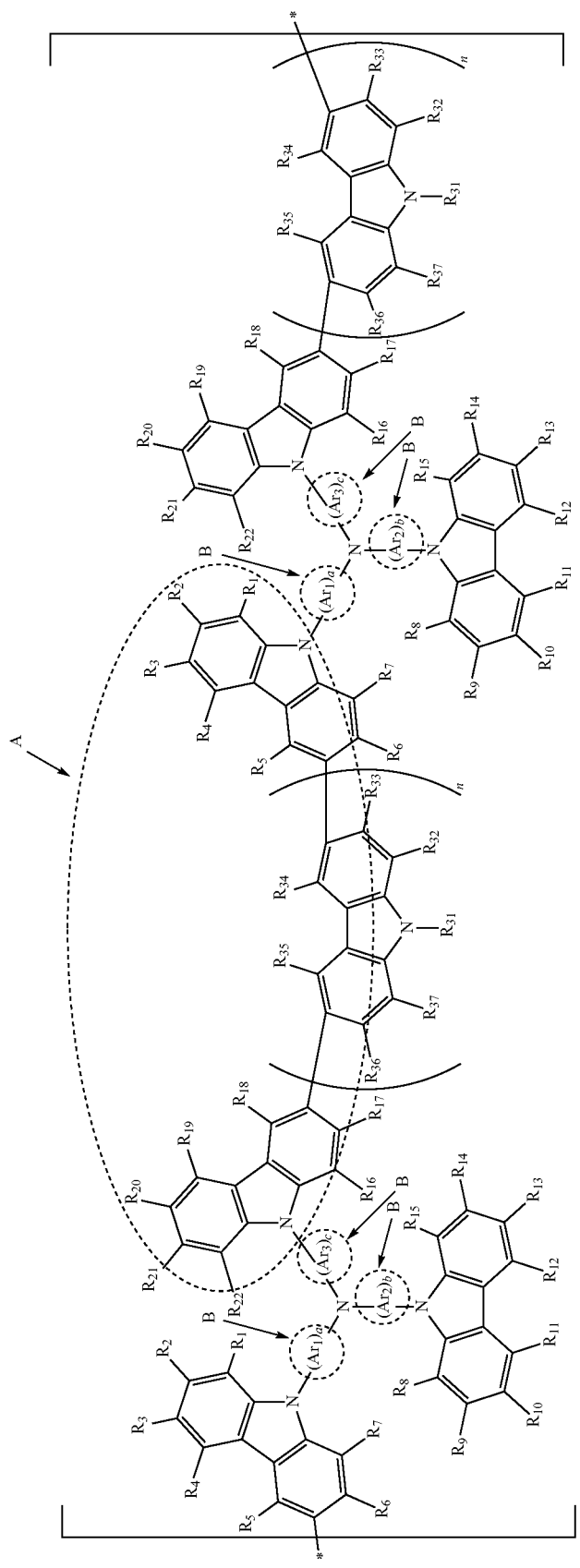

In Formula 1-1 above, carbazole rings in a region A may effectively transport holes. For example, n in the region A may be adjusted to control the transport of holes. In Formula 1-1, an arylene group(s) and/or heteroarylene group(s) in a region B may effectively transport electrons.

Thus, the polymer comprising a polymeric unit of Formula 1 is a bipolar polymer with the ability to transport both holes and electrons in its molecular structure, and thus can effectively implement and maintain a balance of holes and electrons.

In addition, the polymer comprising a polymeric unit of Formula 1 may have a very high triplet state energy level. For example, carbazole rings linked at No. 3 and No. 6 carbon atoms of the carbazole ring in the region A may contribute to maintaining a high energy band gap ("Eg") and triplet state energy ("$E_T$") even when a conjugation length in the region A is increased.

Thus, the polymer comprising a polymeric unit of Formula 1 may be used, for example, for an emission layer of an OLED together with a phosphorescent dopant, thereby contributing to emitting light according to a phosphorescence mechanism. In other words, since the polymer comprising a polymeric unit of Formula 1 may have bipolar characteristics and may be used as a phosphorescent host in the emission layer of the OLED, the polymer comprising a polymeric unit of Formula 1 may be referred to as a bipolar polymer available as a phosphorescent host.

"Alkyl," as used herein, refers toto a straight or branched chain saturated aliphatic hydrocarbon. Alkyl groups include, for example, groups having from 1 to 30 carbon atoms ($C_1$-$C_{30}$ alkyl). Examples of unsubstituted $C_1$-$C_{30}$ alkyl groups include a methyl group, an ethyl group, a propyl group, an isobutyl group, a sec-butyl group, a pentyl group, an iso-amyl group and a hexyl group. In a substituted $C_1$-$C_{30}$ alkyl group, at least one hydrogen atom is replaced with a halogen atom, a $C_1$-$C_{30}$ alkyl group, a $C_1$-$C_{30}$ alkoxy group, a $C_1$-$C_{10}$ alkylamino group, a $C_6$-$C_{14}$ arylamino group, a $C_6$-$C_{30}$ aryl group, a $C_3$-$C_{30}$ heteroaryl group, a hydroxyl group, a nitro group, a cyano group, an amino group, an amidino group, hydrazine, hydrazone, a carboxyl group, a sulfonic acid group or a phosphoric acid group.

"Alkenyl" refers to a straight or branched chain hydrocarbon that comprises at least one carbon-carbon double bond. An example of an unsubstituted $C_2$-$C_{30}$ alkenyl group is an ethenyl group. In a substituted $C_2$-$C_{30}$ alkenyl group, at least one hydrogen atom is replaced with a substituent described above in conjunction with the substituted $C_1$-$C_{30}$ alkyl group.

Similarly, "alkynyl" refers to a straight or branched chain hydrocarbon that has one or more unsaturated carbon-carbon bonds, at least one of which is a triple bond.

"Alkoxy," as used herein, refers to an alkyl moiety that is linked via an oxygen (i.e., —O-alkyl). Examples of an unsubstituted $C_1$-$C_{30}$ alkoxy group include a methoxy group, an ethoxy group, a propoxy group, an isobutyloxy group, a sec-butyloxy group, a pentyloxy group, an iso-amyloxy group and a hexyloxy group. In a substituted $C_1$-$C_{30}$ alkoxy group, at least one hydrogen atom is replaced with a substituent described above in conjunction with the substituted $C_1$-$C_{30}$ alkyl group.

A "$C_1$-$C_{10}$ alkylamino" group is a group in which one or two alkyl moieties are linked via a nitrogen (i.e., —NH-alkyl or N(alkyl)(alkyl), in which each alkyl group is the same or different, such that the total number of carbon atoms ranges from 1 to 10). Substitution is as described above for the substituted $C_1$-$C_{30}$ alkyl group.

A "$C_6$-$C_{14}$ arylamino" group a group in which one or two aryl moieties are linked via a nitrogen (i.e., —NH-aryl or N(aryl)(aryl), in which each aryl group is the same or different, such that the total number of carbon atoms ranges from 6 to 14). Substitution is as described above for the substituted $C_1$-$C_{30}$ alkyl group.

Throughout the specification, the $C_6$-$C_{30}$ aryl group refers to a monovalent carbocyclic aromatic system including one or more aromatic rings. More than one ring may be present, and any additional rings may be independently aromatic, saturated or partially unsaturated. When the $C_6$-$C_{30}$ aryl group includes two or more rings, these rings may be attached to each other using a pendent method or may be fused together or Spiro. Representative 'aryl' groups include phenyl, naphthyl or tetrahydronaphthyl. In a substituted aryl group, one or more hydrogen atoms are replaced with a substituent described above in conjunction with the unsubstituted $C_1$-$C_{30}$ alkyl group.

The $C_3$-$C_{30}$ heteroaryl group refers to a monovalent ring system that includes 3-30 carbon ring atoms, wherein at least one (e.g., one, two or three) ring atoms is a heteroatom selected from nitrogen (N), oxygen (O), phosphorus (P) and sulfur (S), and the other ring atoms are carbons (C). At least one ring comprising a heteroatom ring member is aromatic. Non-aromatic and/or carbocyclic rings may also be present in a heteroaryl group, provided that at least one ring is both aromatic and contains a ring member that is a heteroatom. When the $C_3$-$C_{30}$ heteroaryl group has two or more rings, these rings may be attached to each other using a pendent method or may be fused together or spiro. Examples of heteroaryl groups include pyridyl, thienyl and furyl. In a substituted heteroaryl group, one or more hydrogen atoms may be replaced with a substituent described above in conjunction with the unsubstituted $C_1$-$C_{30}$ alkyl group.

Throughout the specification, the substituted or unsubstituted $C_3$-$C_{30}$ arylene group is a bivalent linking group having the same structure as a substituted or unsubstituted $C_6$-$C_{30}$ aryl group, and the substituted or unsubstituted $C_3$-$C_{30}$ heteroarylene group is a bivalent linking group having the same structure as a substituted or unsubstituted $C_3$-$C_{30}$ heteroaryl group.

Examples of the substituted or unsubstituted $C_6$-$C_{30}$ arylene group and the substituted or unsubstituted $C_3$-$C_{30}$ heteroarylene group will be easily understood by one of ordinary skill in the art with reference to those of the substituted or unsubstituted $C_6$-$C_{30}$ aryl group and the $C_3$-$C_{30}$ heteroaryl group described above.

The polymer comprising a polymeric unit of Formula 1 may be synthesized using a known method in the art, such as Yamamoto coupling or Suzuki coupling. This will be easily understood by one of ordinary skill in the art with reference to the Examples herein.

According to another embodiment of the present invention, an OLED includes a substrate, a first electrode, a second electrode and a first layer disposed between the first electrode and the second electrode, the first layer including the polymer comprising a polymeric unit of Formula 1 above.

The first layer may function as, for example, an emission layer.

If the first layer functions as an emission layer, the first layer may further include a phosphorescent dopant. The phosphorescent dopant used in the first layer may be any known phosphorescent dopant. Representative phosphorescent dopants include an organometallic complex including at least one metal selected from iridium (Ir), platinum (Pt), osmium (Os), rhenium (Re), titanium (Ti), zirconium (Zr), hafnium (Hf) and a combination of at least two of the foregoing.

For example, in certain embodiments the phosphorescent dopant may include at least one material selected from bisthienylpyridine acetylacetonate iridium, bis(benzothienylpyridine)acetylacetonate iridium, bis(2-phenylbenzothiazole)acetylacetonate iridium, bis(1-phenylisoquinoline) iridium acetylacetonate, tris(1-phenylisoquinoline) iridium, tris (2-diphenylpyridine) iridium, tris(3-biphenyl pyridine) iridium, tris(4-biphenyl pyridine) iridium, Ir(pq)₂(acac) (wherein "pq" is an abbreviation for 2-phenylquinoline; and "acac" is an abbreviation for acetylacetone, see Compound 10 below), Ir(ppy)₃ (wherein "ppy" is an abbreviation for phenylpyridine, see Compound 11 below), platinum(II)octaethylporphyrin ("PtOEP," see the indicated compound below), Compound 12 below, Firpic (see Compound 13 below), Ir(piq)₃ (see the indicated compound below), Ir(piq)₂acac (wherein "piq" is an abbreviation for pentylisoquinoline, see Compound 14 below), Btp₂Ir(acac) (see the indicated compound below), F₂Irpic (see the indicated compound below), (F₂ ppy)₂Ir(tmd) (see the indicated compound below) and Ir(dfppz)₃ (see the indicated compound below), but is not limited thereto:

Compound 10

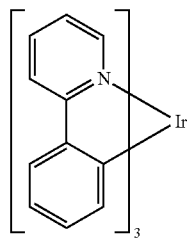

Pq₂Ir(acac)

Compound 11

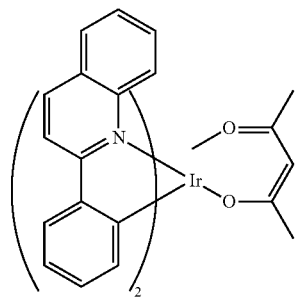

Compound 12

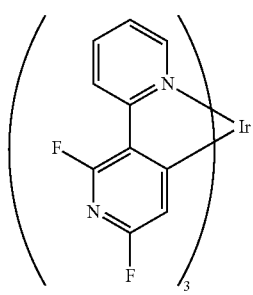

Compound 13

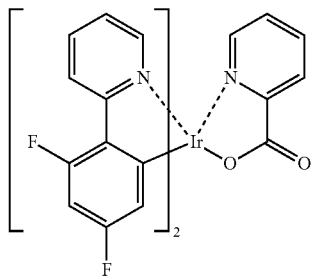

Compound 14

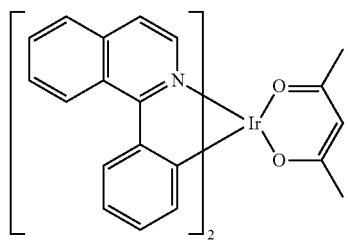

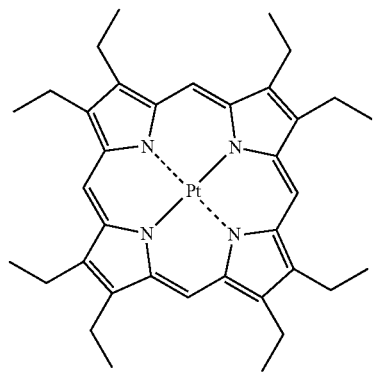

PtOEP

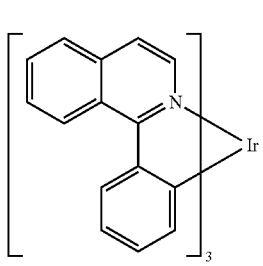

Ir(piq)₃

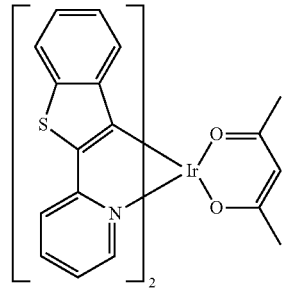

Btp₂Ir(acac)

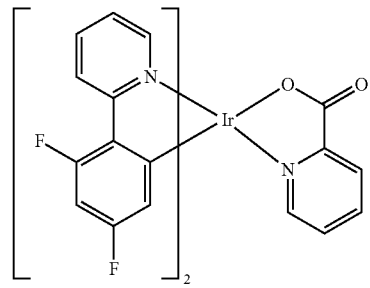

F₂Irpic

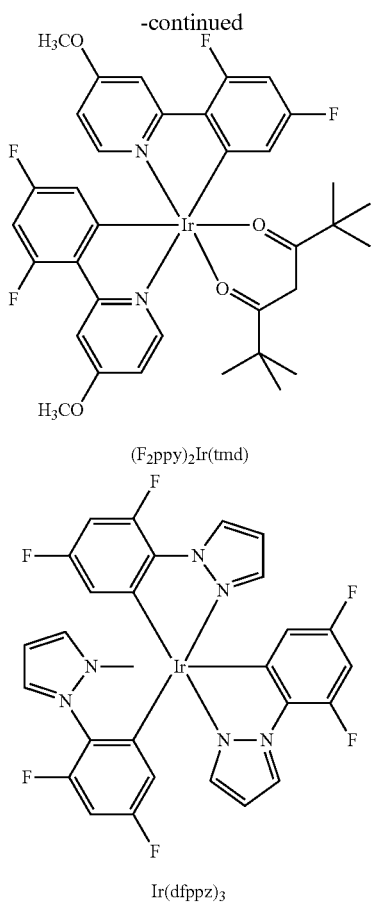

(F₂ppy)₂Ir(tmd)

Ir(dfppz)₃

In addition to the first layer that may function as an emission layer as described above, the OLED may further include at least one layer selected from a hole injection layer ("HIL"), a hole transport layer ("HTL"), a hole blocking layer ("HBL"), an electron transport layer ("ETL") and an electron injection layer ("EIL") between the first electrode and second electrode.

FIG. 1 is a schematic sectional view of an OLED according to an embodiment of the present invention. Referring to FIG. 1, the OLED includes a substrate 10, a first electrode 11, a HTL 13, a first layer 15, an ETL 17, an EIL 18 and a second electrode 19. The first layer 15 may function as an emission layer ("EML"). Hereinafter, the OLED and a representative method of manufacturing the same will be described in detail.

First, the first electrode 11 is formed on the substrate 10 by deposition, ion plating, plating or sputtering. The first electrode 11 may be formed of a first electrode-forming material having a high work function. The first electrode 11 may constitute an anode that may inject holes or a cathode that may inject electrons. The substrate 10 may be any substrate that is used in general organic light-emitting devices. Representative substrates include, for example, a glass substrate or a transparent plastic substrate with suitable mechanical strength, thermal stability, transparency, surface smoothness, ease of handling and waterproofness. Representative examples of the first electrode-forming material include a metal oxide, a metal sulfide and a metal, all of which have a high electrical conductivity. In general, these materials are used to form a thin film. Examples of such first electrode-forming material include indium oxide, zinc oxide, tin oxide, a combination thereof, such as indium tin oxide ("ITO") or indium zinc oxide ("IZO"), gold (Au), platinum (Pt), silver (Ag) and copper (Cu). Alternatively, or in addition, polyaniline or a derivative thereof, or polythiophene or a derivative thereof may be used as the first electrode-forming material. The first electrode may have a monolayered structure or a multilayered structure including at least two layers. The first electrode may, but need not, contain at least two different materials. The thickness of the first electrode may be appropriately varied based on considerations of light transmittance and electrical conductivity; for example, the thickness may range from about 10 nm to about 10 μm.

Next, although not illustrated in FIG. 1, if the first electrode 11 is an anode, a HIL may be further formed on the first electrode 11. The HIL may be formed by any suitable technique, such as vacuum deposition, spin coating, casting, ink-jet printing, Langmuir-Blodgett ("LB") deposition or the like.

When the HIL is formed using vacuum deposition, the deposition conditions may vary according to the material that is used to form the HIL and the structure and thermal properties of the HIL to be formed. In general, however, conditions for vacuum deposition may include a deposition temperature of 100 to 500° C., a pressure of $10^{-8}$ to $10^{-3}$ torr and a deposition rate of 0.01 to 100 Å/sec.

When the HIL is formed using spin coating, the coating conditions may vary according to the material that is used to form the HIL, and the structure and thermal properties of the HIL to be formed. In general, however, conditions for spin coating may include a coating rate of about 2000 to about 5000 rpm, and a heat treatment temperature of about 80 to 300° C. for removing a solvent after coating.

The HIL may be formed of any material that is commonly used to form a HIL. Examples of the material that may be used to form the HIL include a phthalocyanine compound such as copper phthalocyanine, 4,4',4"-tris (3-methylphenylphenylamino) triphenylamine ("m-MTDATA"), N,N'-di(1-naphthyl)-N,N'-diphenylbenzidine ("NPB"), TDATA (see a formula below) and 2T-NATA (see a formula below), but are not limited thereto.

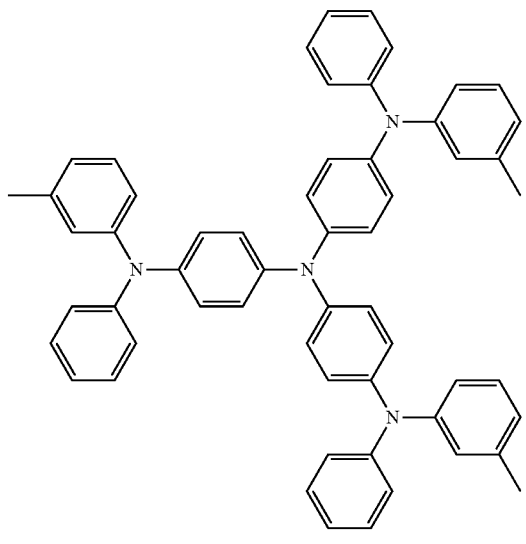

m-MTDATA

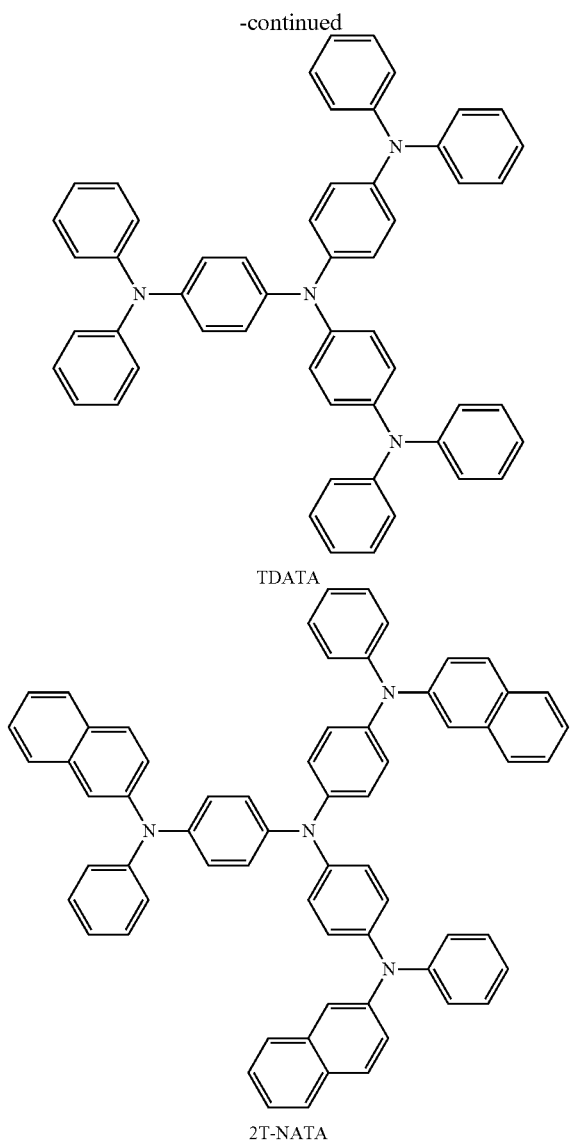

TDATA

2T-NATA

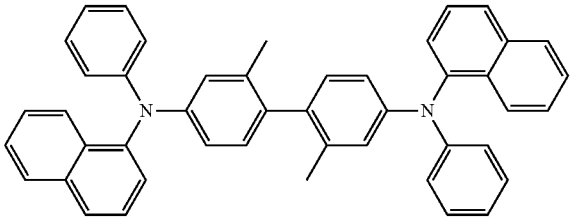

α-NPD

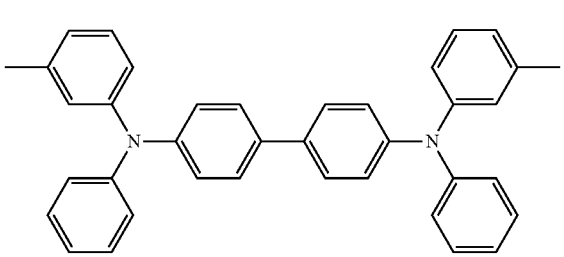

TPD dioxythiophene)/poly(4-styrenesulfonate) ("PEDOT/PSS," see the indicated formula below); polyaniline/camphor sulfonic acid ("Pani/CSA"); and polyaniline/poly(4-styrenesulfonate ("PANI/PSS"), but are not limited thereto.

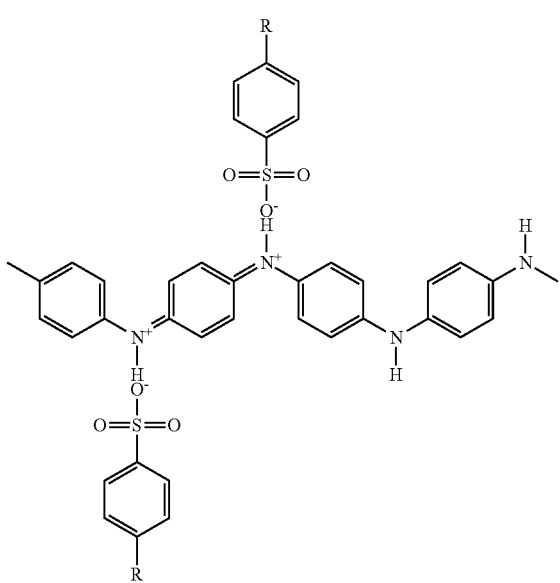

Pani/DBSA

The thickness of the HIL may be about 100 to about 10000 Å, for example, 100 to about 1000 Å. When the thickness of the HIL is within the above range, the HIL may have satisfactory hole injection properties without an increase in driving voltage.

Next, the HTL 13 may be formed on the first electrode or the HIL by using a technique such as vacuum deposition, spin coating, casting, inkjet printing or LB deposition.

When the HTL 13 is formed using vacuum deposition or spin coating, the conditions for deposition and coating are similar to those for the formation of the HIL, though the precise conditions for the deposition and coating may vary according to the material that is used to form the HTL.

The HTL 13 may be formed of any known materials used to form a HTL. Examples of materials that may be used to form the HTL 13 include an amine derivative having an aromatic condensed ring, such as N,N'-bis(3-methylphenyl)-N,N'-diphenyl-[1,1-biphenyl]-4,4'-diamine ("TPD," see the indicated formula below) or N,N'-di(naphthalene-1-yl)-N,N'-diphenylbenzidine ("NPD," see the indicated formula below); polyaniline/dodecylbenzenesulfonic acid ("Pani/DBSA," see the indicated formula below); poly(3,4-ethylene-

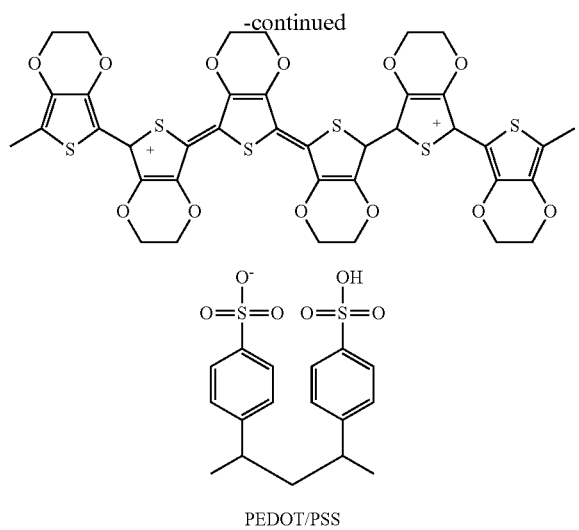

PEDOT/PSS

The thickness of the HTL 13 may generally be in the range of about 50 to about 1,000 Å, for example, about 100 to about 600 Å. When the thickness of the HTL 13 is within the above range, the HTL 13 may have satisfactory hole transport properties without a substantial increase in driving voltage.

The first layer 15, which may function as an EML, may be formed on the hole transport layer 13. The first layer 15 may be formed by any suitable technique, such as spin coating, casting, inkjet printing, LB deposition or the like. When the first layer 15 is formed using spin coating, the conditions for forming the first layer 15 are similar to those for the formation of the HIL, though the precise conditions for forming the first layer 15 may vary according to the material that is used to form the first layer 15.

The first layer 15 may include the polymer of Formula 1 above as a host. Optionally, in certain embodiments, the first layer 15 may further include one or more phosphorescent dopants, in addition to the polymer of Formula 1. Examples of suitable phosphorescent dopants are described above.

In certain embodiments in which the first layer 15 includes a polymer comprising, a polymeric unit of Formula 1 and a phosphorescent dopant, the amount of the phosphorescent dopant may be in the range of about 1 wt % to about 10 wt % based on a total weight (100 wt %) of the first layer 15. When the amount of the phosphorescent dopant is within the above range, concentration quenching may be substantially prevented.

Alternatively, the first layer 15 may exclusively include a polymer comprising a polymeric unit of Formula 1 or may further include a known fluorescent dopant, in addition to the polymer comprising a polymeric unit of Formula 1.

In certain embodiments, the thickness of the first layer 15, which may function as an EML, may be in the range of about 100 to about 1,000 Å, for example, about 200 to about 900 Å. When the thickness of the first layer 15 is within the above range, the first layer 15 may have satisfactory light emission characteristics without a substantial increase in driving voltage.

An optional HBL may further be formed on the first layer 15, if desired, although not illustrated in FIG. 1.

The HBL may prevent triplet excitons or holes in the first layer 15 from diffusing into the second electrode 19. The HBL may be formed by using any suitable technique, such as vacuum deposition, spin coating, casting, LB deposition or the like. When the HBL is formed using vacuum deposition or spin coating, the deposition and coating conditions may be similar to whose for the formation of the HIL, though the conditions for deposition and coating may vary according to the material that is used to form the HBL. Examples of materials that may be used to form the HBL include an oxadiazole derivative, a triazole derivative, a phenanthroline derivative and TAZ (see the formula below), but are not limited thereto.

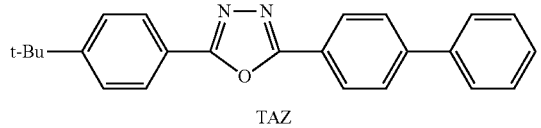

TAZ

In certain embodiments, the thickness of the HBL may be about 50 to about 1000 Å, for example, about 100 to about 300 Å. When the thickness of the HBL is within the above range, the HBL may have satisfactory hole blocking properties.

Next, the ETL 17 may be formed on the HBL or EML by using any suitable technique, such as vacuum deposition, spin coating, casting or the like. When the ETL is formed using vacuum deposition or spin coating, the deposition and coating conditions may be similar to those for the formation of the HIL, though the deposition and coating conditions may vary according to the material that is used to form the ETL. Examples of materials that may be used to form the ETL include any known materials that stably transport electrons injected from an electron injection electrode, that is, a cathode, such as a quinoline derivative, 4,7-diphenyl-1,10-phenanthroline ("Bphen"), BAlq (see formula below), tris(8-quinolinolato)aluminum ($Alq_3$), beryllium bis(benzoquinolin-10-olate) ("$Bebq_2$") or TPBi (see formula below).

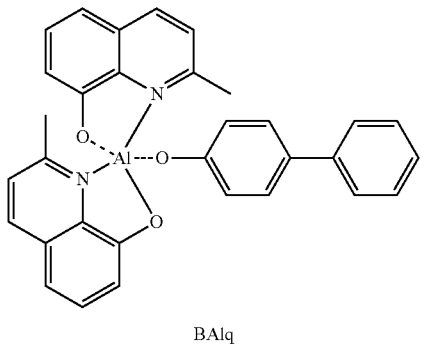

BAlq

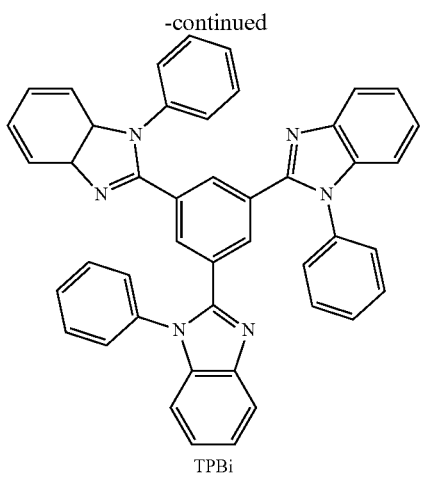

TPBi

In certain embodiments, the thickness of the ETL 17 may be in the range of about 100 to about 1,000 Å, for example, about 200 to about 500 Å. When the thickness of the ETL 17 is within the above range, the HTL may have satisfactory electron transport properties without a substantial decrease in driving voltage.

Next, the EIL 18 may be formed on the ETL 17 or the EML. The EIL 18 may be formed of any known material, such as LiF, NaCl, CsF, $Li_2O$, BaO, $BaF_2$ or the like. The deposition and coating conditions for the EIL 18 may be similar to those for the formation of the HIL, though the deposition and coating conditions may vary according to the material that is used to form the EIL 18.

In certain embodiments, the thickness of the EIL 18 may be in the range of about 1 to about 100 Å, for example, about 5 to about 50 Å. When the thickness of the EIL 18 is within the above range, the EIL 18 may have satisfactory electron injection properties without an increase in driving voltage.

Finally, the second electrode 19 may be formed on the EIL 18. The second electrode 19 may be formed according to the method described above in conjunction with the first electrode 11. The second electrode 19 may be a cathode or an anode. When the second electrode 19 is a cathode, the second electrode 19 may be formed of a material having a low work function. Examples of the material having a low work function include an alkali metal, such as lithium (Li), sodium (Na), potassium (K), rubidium (Rb) or cesium (Cs); an alkali earth metal, such as beryllium (Be), magnesium (Mg), calcium (Ca), strontium (Sr) or barium (Ba); a metal, such as aluminum (Al), scandium (Sc), vanadium (V), zinc (Zn), yttrium (Y), indium (In), cerium (Ce), samarium (Sm), europium (Eu), terbium (Tb) and ytterbium (Yb); an alloy of at least two of these metals; an alloy of at least one of these metals with gold (Au), silver (Ag), platinum (Pt), copper (Cu), manganese (Mg), titanium (Ti), cobalt (Co), nickel (Ni), tungsten (W) or tin (Sn); graphite; and graphite intercalation compound, but are not limited thereto. Examples of alloys that may be used to form the second electrode 19 include a Mg—Ag alloy, a Mg—In alloy, a Mg—Al alloy, an In—Ag alloy, a Li—Al alloy, a Li—Mg alloy, a Li—In alloy and a Ca—Al alloy. The second electrode 19 may be formed as a monolayer, or a multilayer including at least two layers. The second electrode 19 may exclusively contain one material or may include two or more different materials. The second electrode 19 may be implemented in various forms, for example, as a transparent, semitransparent or reflective electrode. The thickness of the second electrode 19 may be in the range of, for example, about 10 nm to about 10 μm, but is not limited thereto.

EXAMPLES

Synthesis Example 1

Synthesis of Compound 1

Compound 1 was synthesized through Reaction Scheme 1 below:

Reaction Scheme 1

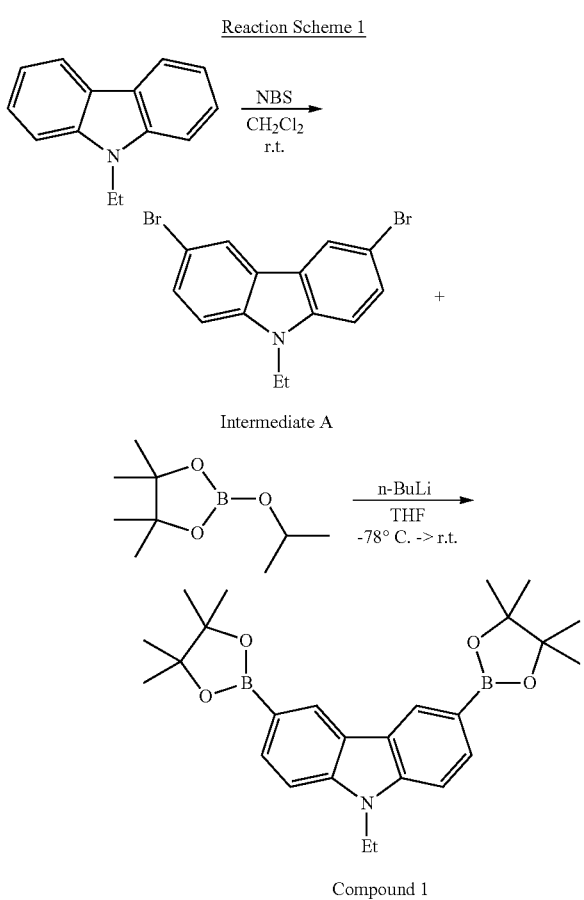

Compound 1

Synthesis of Intermediate A

A mixture of 20.13 g (100.0 mmol) of 9-ethylcarbazole, 3.738 g (210.0 mmol) of N-bromosuccinimide ("NBS") and 100 mL of $CH_2Cl_2$ was stirred at room temperature (about 25° C.) to obtain 53.54 g of Intermediate A with a yield of 98%.

$^1$H-NMR (300 MHz, $CDCl_3$): δ=8.121 (s, 2H), 7.568 (d, 2H), 7.281 (d, 2H), 4.319 (q, 2H), 1.419 (t, 3H)

$^{13}$C-NMR (75 MHz, $CDCl_3$): δ=138.8, 129.0, 123.5, 123.2, 111.9, 110.1, 37.81, 13.69

Synthesis of Compound 1

2.758 g (10.00 mmol) of Intermediate A was mixed with 20 mL of tetrahydrofuran ("THF") in a −76° C., dry ice bath, and 15.6 mL (25.00 mmol) of n-BuLi (1.6 M in hexane) was added thereto. The mixture was stirred at −78° C. for 2 hours, and a mixture of 6.3 mL (30 mmol) of 2-isopropoxy-4,4,5,5-tetramethyl-1,3,2-dioxaborolane with 10 mL of THF was further added. Then, the temperature was raised to room temperature (about 25° C.), and the mixture was stirred to obtain 2.50 g of Compound 1 with a yield of 56%.

$^1$H-NMR (300 MHz, CDCl$_3$): δ=8.700 (s, 2H), 7.957 (d, 2H), 7.439 (d, 2H), 4.435 (q, 2H), 1.477 (t, 3H), 1.418 (s, 24H)

$^{13}$C-NMR (75 MHz, CDCl$_3$): δ=142.1, 132.0, 128.1, 122.9, 107.8, 83.5, 37.6, 24.9, 13.7

Synthesis Example 2

Synthesis of Compound 2

Compound 2 was synthesized through Reaction Scheme 2 below:

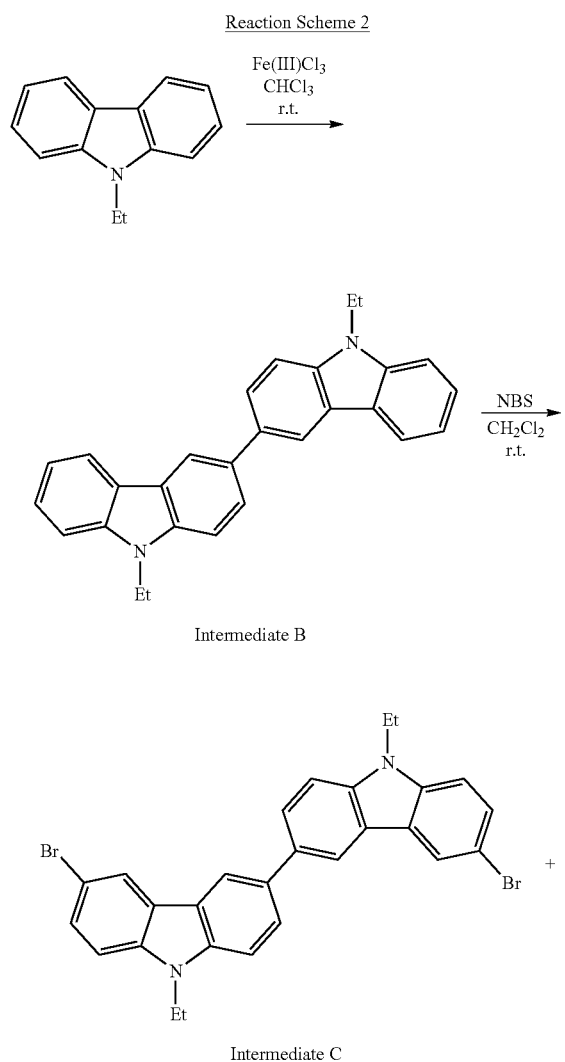

Intermediate C

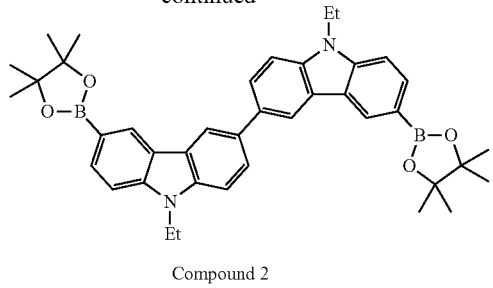

Compound 2

Synthesis of Intermediate B

A mixture of 20.13 g (100.0 mmol) of 9-ethylcarbazole, 13.06 g (210.0 mmol) of Fe(III)Cl$_3$ and 20 mL of CHCl$_3$ was stirred at room temperature 20 mL and purified to obtain 34.97 g of Intermediate B with a yield of 90%.

$^1$H-NMR (300 MHz, CDCl$_3$): δ=8.443 (s, 2H), 8.234 (d, 2H), 7.882 (d, 2H), 7.549 (m, 6H), 7.307 (d, 2H), 4.487 (q, 4H), 1.535 (t, 6H)

$^{13}$C-NMR (75 MHZ, CDCl$_3$): δ=140.3, 139.0, 133.5, 125.7, 125.6, 123.5, 123.2, 120.6, 119.1, 118.8, 108.7, 108.6, 37.6, 14.0

Synthesis of Intermediate C 34.97 g (90.00 mmol) of Intermediate B, 40.05 g (225.0 mmol) of NBS and 90 mL of CH$_2$Cl$_2$ were mixed at room temperature and purified to obtain 48.18 g of Intermediate C with a yield of 98%.

$^1$H-NMR (300 MHZ, CDCl$_3$): δ=8.335 (d, 4H), 7.854 (d, 2H), 7.583 (d, 2H), 7.492 (d, 2H), 7.280 (d, 2H), 4.389 (q, 4H), 1.480 (t, 6H)

$^{13}$C-NMR (75 MHz, CDCl$_3$): δ=139.3, 138.9, 133.4, 128.3, 126.1, 124.8, 123.2, 122.5, 119.0, 111.6, 110.0, 109.0, 37.7, 13.8

Synthesis of Compound 2

5.462 g (10.00 mmol) of Intermediate C was mixed with 20 mL of THF in a −78° C., dry ice bath, and 15.6 mL (25.00 mmol) of n-BuLi (1.6 M in hexane) was added thereto. The mixture was stirred at −78° C. for 2 hours, and a mixture of 6.3 mL (30 mmol) of 2-isopropoxy-4,4,5,5-tetramethyl-1,3,2-dioxaborolane with 10 mL of THF was further added. Then, the temperature was raised to room temperature (about 25° C.), and the mixture was stirred to obtain 2.95 g of Compound 2 with a yield of 46%.

$^1$H-NMR (300 MHZ, CDCl$_3$): d=8.74 (s, 2H), 8.53 (s, 2H), 7.99 (d, 2H), 7.89 (d, 2H), 7.54 (d, 2H), 7.47 (d, 2H), 4.48 (q, 4H), 1.53 (t, 6H), 1.45 (s, 24H)

Synthesis Example 3

Synthesis of Compound 3

Compound 3 was synthesized through Reaction Scheme 3 below:

Reaction Scheme 3

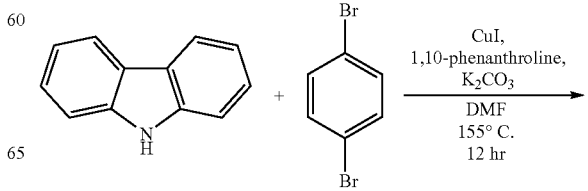

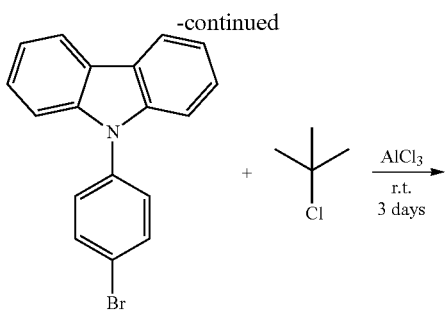

Intermediate D

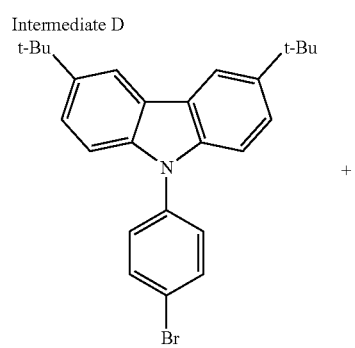

Intermediate E

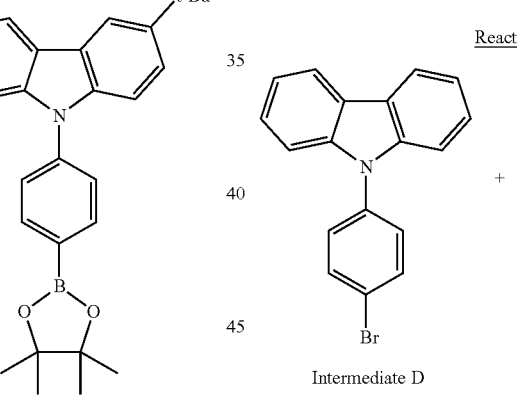

Compound 3

Synthesis of Intermediate D

A mixture of 17.06 g (100.0 mmol) of carbazole, 24.07 g (100.0 mmol) of 1,4-dibromobenzene, 1.904 g (10 mmol) of CuI, 5.460 g (30.00 mmol) of 1,10-phenanthroline, 23.46 g (170.0 mmol) of $K_2CO_3$, and 100 mL of dimethylformamide ("DMF") was stirred at 155° C. for 12 hours to obtain 28.42 g of Intermediate D with a yield of 77%.

Synthesis of Intermediate E

A mixture of 28.42 g (76.98 mmol) of Intermediate D, 20 mL of tert-butyl chloride and 513 mg (3.849 mmol) of $AlCl_3$ was stirred at room temperature (about 25° C.) for about 3 days to obtain 26.42 g of Intermediate E with a yield of 79%.

$^1$H-NMR (300 MHz, $CDCl_3$): δ=8.270 (s, 2H), 7.779 (d, 2H), 7.550 (m, 4H), 7.417 (d, 2H), 1.579 (s, 18H)

$^{13}$C-NMR (75 MHz, $CDCl_3$): δ=143.2, 139.0, 137.3, 133.0, 128.3, 123.8, 123.6, 120.3, 116.4, 109.1, 34.8, 32.1

Synthesis of Compound 3

4.344 g (10.00 mmol) of Intermediate E was mixed with 20 mL of THF in a −78° C., dry ice bath, and 15.6 mL (25.00 mmol) of n-BuLi (1.6 M in hexane) was added thereto. The mixture was stirred at −78° C. for 2 hours, and a mixture of 6.3 mL (30 mmol) of 2-isopropoxy-4,4,5,5-tetramethyl-1,3,2-dioxaborolane with 10 mL of THF was further added. Then, the temperature was raised to room temperature (about 25° C.), and the mixture was stirred to obtain 2.696 g of Compound 3 with a yield of 56%.

$^1$H-NMR (300 MHz, $CDCl_3$): δ=8.110-7.371 (m, 10H), 1.533 (dd, 18H)

$^{13}$C-NMR (75 MHz, $CDCl_3$): δ=149.1, 141.0, 138.9, 136.3, 126.1, 125.9, 123.3, 121.2, 119.6, 119.5, 118.0, 116.2, 106.1, 84.1, 35.2, 34.7, 32.0, 31.8, 31.7, 30.2, 24.9

Synthesis Example 4

Synthesis of Compounds 4 and 5

Compounds 4 and 5 were synthesized through Reaction Scheme 4 below:

Reaction Scheme 4

Intermediate D

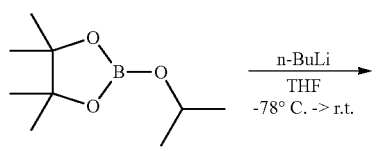

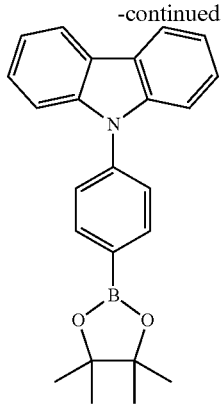

Compound 4

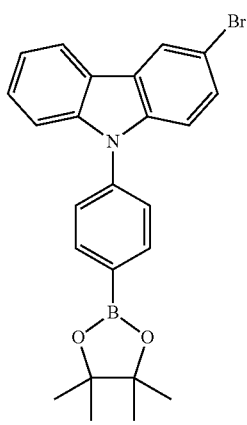

Compound 5

Synthesis of Compound 4

3.692 g (10.00 mmol) of Intermediate D was mixed with 20 mL of THF in a −78° C., dry ice bath, and 15.6 mL (25.00 mmol) of n-BuLi (1.6 M in hexane) was added thereto. The mixture was stirred at −78° C. for 2 hours, and a mixture of 6.3 mL (30 mmol) of 2-isopropoxy-4,4,5,5-tetramethyl-1,3,2-dioxaborolane with 10 mL of THF was further added. Then, the temperature was raised to room temperature (about 25° C.), and the mixture was stirred to obtain 2.400 g of Compound 4 with a yield of 65%.

$^1$H-NMR (300 MHz, CDCl$_3$): δ=8.199 (d, 2H), 8.126 (d, 2H), 7.661 (d, 2H), 7.514 (m, 4H), 7.361 (m 2H), 1.449 (s, 12H)

$^{13}$C-NMR (75 MHz, CDCl$_3$): δ=140.6, 140.4, 136.4, 126.1, 126.0, 123.5, 120.3, 120.0, 109.8, 84.1, 24.9

Synthesis of Compound 5

A mixture of 2.400 g (6.499 mmol) of Compound 4, 1.156 g (6.499 mmol) of NBS, 20 mL of CH$_2$Cl$_2$ was stirred at room temperature (about 25° C.) to obtain 2.475 g of Compound 5 with a yield of 85%.

$^1$H-NMR (300 MHz, CDCl$_3$): δ=8.269 (s, 1H), 8.263 (m, 3H), 7.590 (d, 2H), 7.516 (d, 1H), 7,461 (d, 2H), 7.337 (d, 2H), 1.431 (s, 12H)

$^{13}$C-NMR (75 MHz, CDCl$_3$): δ=140.9, 139.8, 136.4, 128.6, 126.7, 126.0, 125.2, 123.0, 122.4, 120.4, 112.8, 111.3, 110.0, 84.1, 24.9

Synthesis Example 5

Synthesis of Compound 6

Compound 6 was synthesized through Reaction Scheme 5 below:

Reaction Scheme 5

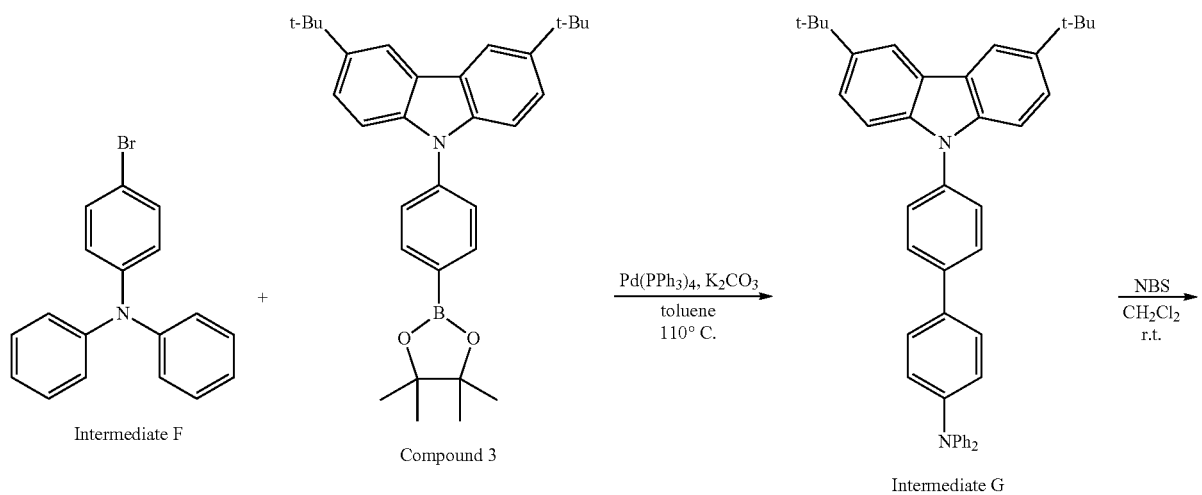

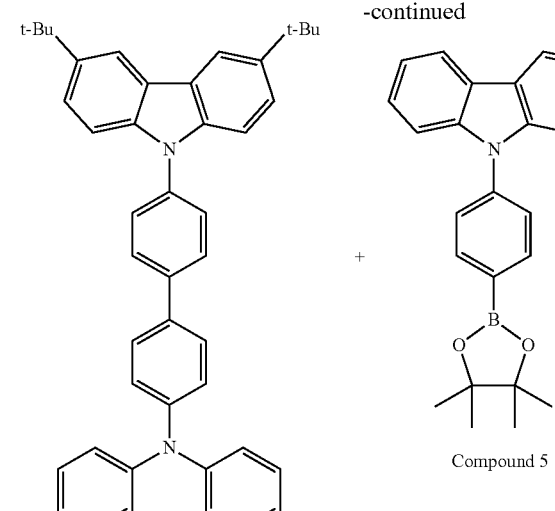

Intermediate H

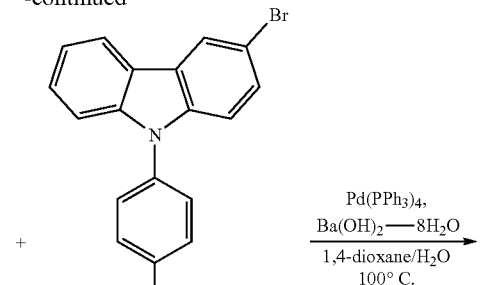

Compound 5

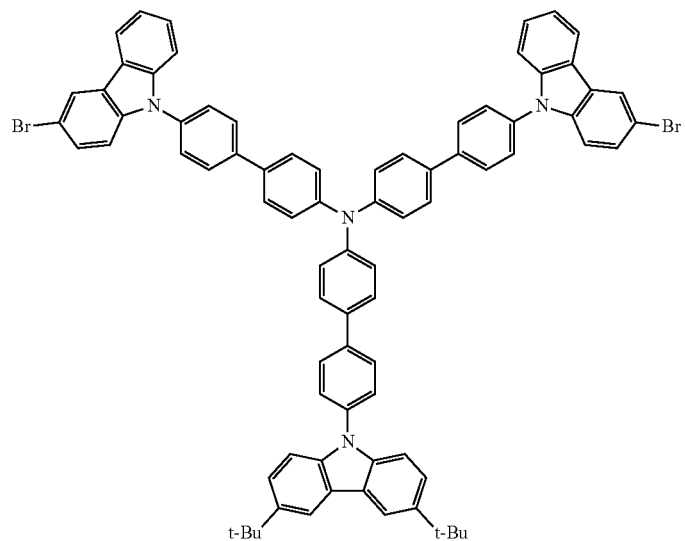

Compound 6

Synthesis of Intermediate G

A mixture of 1.675 g (5.014 mmol) of Intermediate F, 2.475 g (5.014 mmol) of Compound 3 obtained in Synthesis Example 3, 580 mg (0.5014 mmol) of tetrakis(triphenylphosphine)palladium ("Pd(PPh$_3$)$_4$"), 10.0 mL of K$_2$CO$_3$ (2.0 M aqueous solution) and 20 mL of toluene (20 mL) was stirred at 100° C. to obtain 2.556 g of Intermediate G with a yield of 85%.

$^1$H-NMR (300 MHz, CDCl$_3$): δ=7.667-7.034 (m, 24H), 1.562 (d, 9H), 1.451 (d, 9H)

$^{13}$C-NMR (75 MHz, CDCl$_3$): δ=147.6, 147.5, 142.9, 142.8, 141.3, 139.3, 136.8, 134.1, 129.3, 129.2, 128.5, 128.3, 127.8, 127.7, 127.1, 126.9, 124.5, 123.9, 123.8, 123.6, 123.1, 122.7, 121.0, 119.6, 117.8, 116.2, 109.3, 106.1, 35.2, 32.1

Synthesis of Intermediate H 2.556 g (4.261 mmol) of Intermediate G, 758 mg (4.261 mmol) of NBS and 20 mL of CH$_2$Cl$_2$ were mixed at room temperature for reaction and purified after completion of the reaction to obtain 3.158 g of Intermediate H with a yield of 98%.

$^1$H-NMR (300 MHz, CDCl$_3$): δ=7.562-6.942 (m, 22H), 1.560 (d, 9H), 1.473 (d, 9H)

$^{13}$C-NMR (75 MHz, CDCl$_3$): δ=141.2, 139.2, 138.9, 137.1, 135.3, 132.5, 132.3, 129.5, 128.5, 127.9, 127.2, 126.9, 125.8, 124.7, 123.7, 121.3, 119.6, 117.9, 116.2, 115.8, 109.2, 106.0, 35.2, 32.0

Synthesis of Compound 6

2.090 g (2.762 mmol) of Intermediate H, 2.475 g (5.523 mmol) of Compound 5 obtained in Synthesis Example 4, 319 mg (0.2762 mmol) of Pd(PPh$_3$)$_4$, 5.334 g (16.57 mmol) of Ba(OH)$_2$-8H$_2$O, 30 mL of 1,4-dioxane and 10 mL of water were stirred at 110° C. to obtain 2.429 g of Compound 6 with a yield of 71%

$^1$H-NMR (300 MHz, CDCl$_3$): δ=8.253-7.019 (m, 44H), 1.569 (d, 9H), 1.520 (d, 9H).

Synthesis Example 6

Synthesis of POLYMER 1

POLYMER 1 was synthesized through Reaction Scheme 6 below:

Reaction Scheme 6

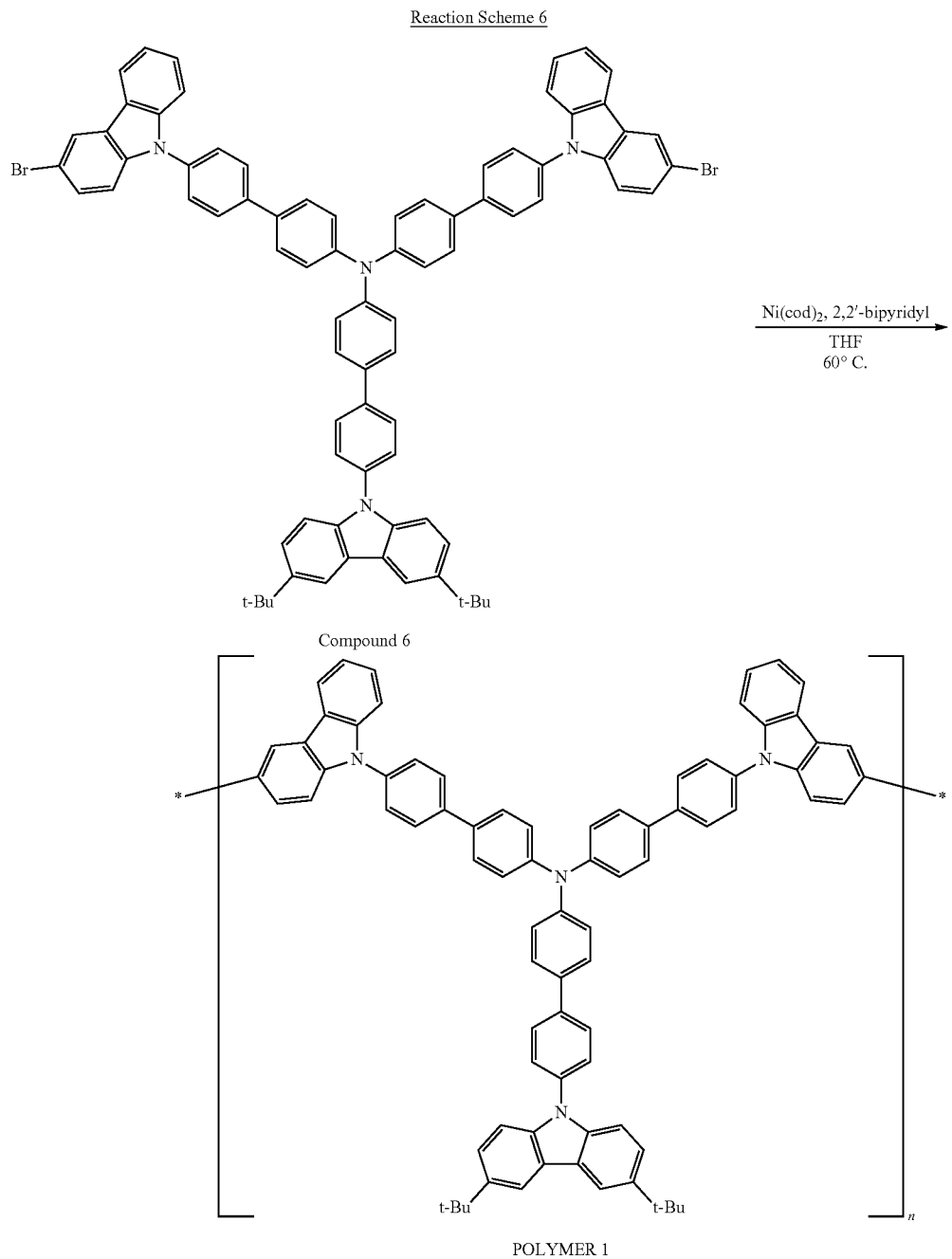

A mixture of 663.9 mg (0.5358 mmol) of Compound 6 obtained in Synthesis Example 5, 368 mg (1.3395 mmol) of Ni(cod)$_2$ (cod=1,5-cyclooctadiene), 209 mg (1.3395 mmol) of 2,2'-bipyridyl and 10 mL of THF was stirred at 60° C. to obtain 306.7 mg of POLYMER 1.

$^1$H-NMR (300 MHz, CDCl$_3$): δ=8.245–7.222 (m, 44H), 1.561 (d, 9H), 1.419 (d, 9H)

Mw (weight average molecular weight)=92800, PDI=3.11

Synthesis Example 7
Synthesis of POLYMER 2
POLYMER 2 was synthesized through Reaction Scheme 7 below:
Reaction Scheme 7
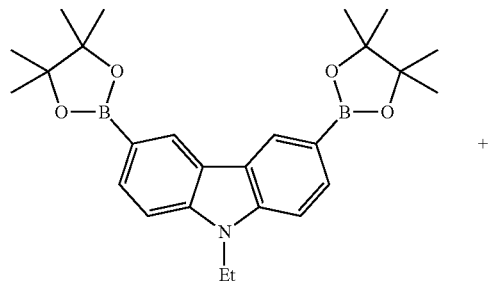
Compound 1
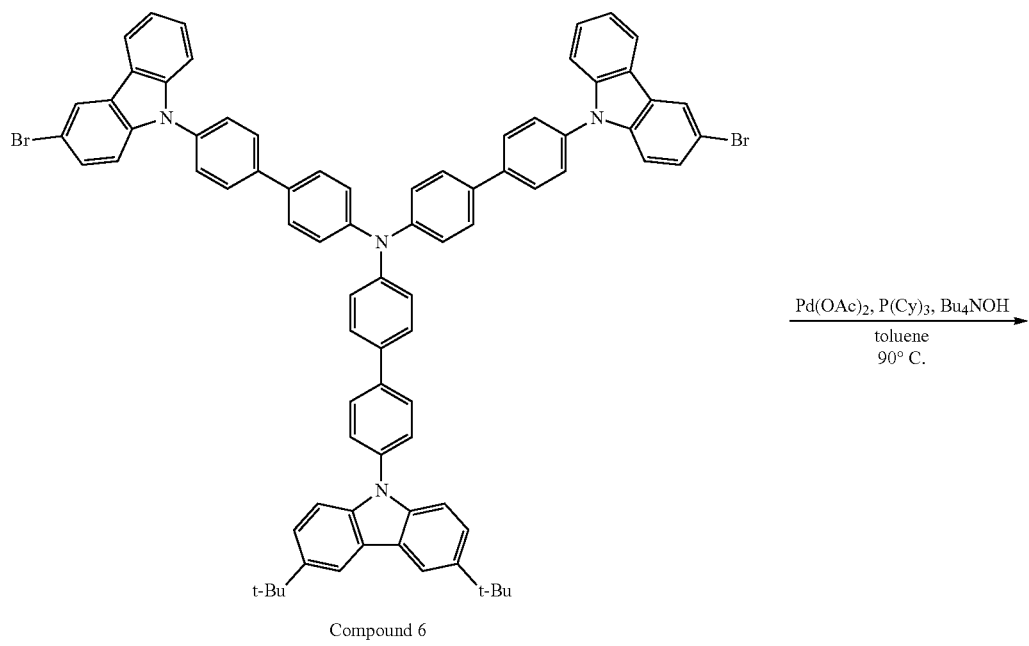
Compound 6

-continued

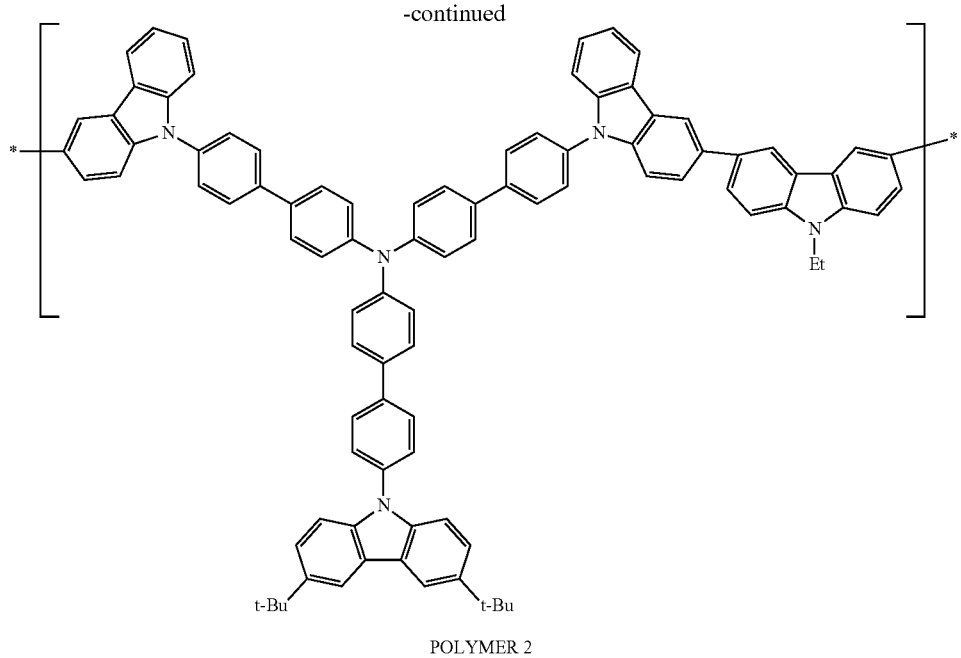

POLYMER 2

A mixture of 249 mg (0.5568 mmol) of Compound 1 obtained in Synthesis Example 1, 689 mg (0.5568 mmol) of Compound 6 obtained in Synthesis Example 5, 2.6 mg (0.01114 mmol) of palladium (II) acetate (Pd(OAc)$_2$), 16 g (0.05565 mmol) of tricyclohexylphosphine (P(Cy)$_3$), 1.8 mL (2.7825 mmol) of tetra-n-butylammonium hydroxide (Bu$_4$NOH) and 30 mL of toluene (30 mL) was stirred at 100° C. to obtain 504 mg of POLYMER 2.

$^1$H-NMR (300 MHz, CDCl$_3$): δ=8.845-7.145 (m, 50H), 4.486 (q, 2H), 1.580 (t, 3H), 1.558 (d, 9H), 1.494 (d, 9H)

Mw=58700, PDI=2.62

Synthesis Example 8

Synthesis of POLYMER 3

POLYMER 3 was synthesized through Reaction Scheme 8 below:

Reaction Scheme 8

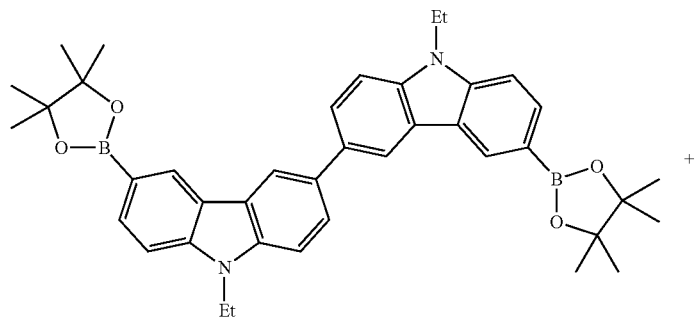

Compound 2

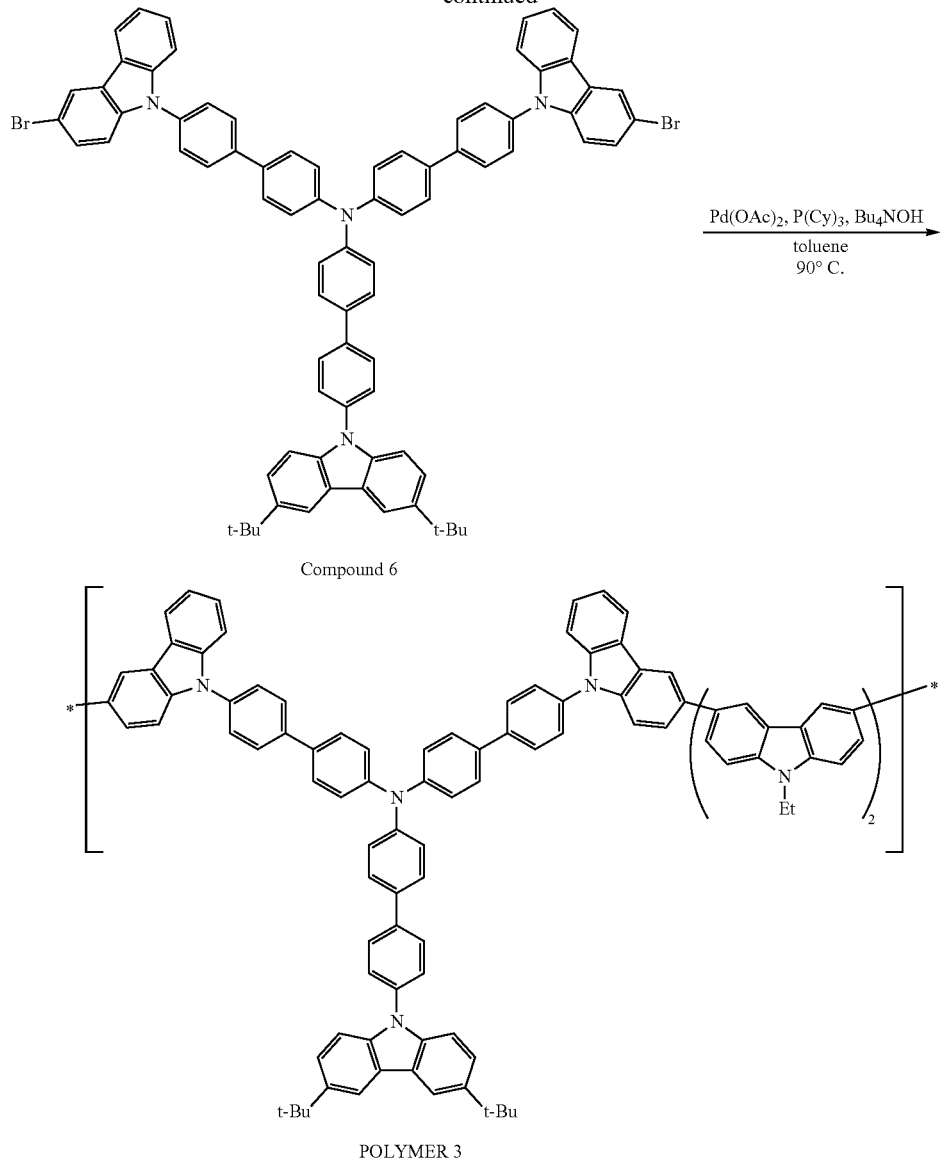

Compound 6

POLYMER 3

205 mg of POLYMER 3 was obtained in the same manner as in Synthesis Example 7, except that 156.2 mg (0.2439 mmol) of Compound 2 obtained in Synthesis Example 2 and 302 mg (0.2439 mmol) of Compound 6 obtained in Synthesis Example 5 were used.

$^1$H-NMR (300 MHz, CDCl$_3$): δ=8.732–7.207 (m, 56H), 4.492 (q, 4H), 1.575 (m, 6H), 1.509 (d, 9H), 1.497 (d, 9H)

Mw=61200, PDI=2.31

Evaluation Example 1

Evaluation of light-emitting properties of compounds (in solution)

Light-emitting properties of POLYMERS 1, 2 and 3 were evaluated using UV absorption and photoluminescence ("PL") spectra thereof. Initially, POLYMER 1 was diluted in toluene to a concentration of 0.2 mM, and then the UV absorption spectrum thereof was measured using a Shimadzu UV-350 Spectrometer. The same process was repeated using POLYMERS 2 and 3. The results are shown in FIG. 2.

In a separate experiment, POLYMER 1 was diluted in toluene to a concentration of 10 mM, and the PL spectrum thereof was measured using an ISC PC1 spectrofluorimeter equipped with a Xenon lamp. The same process was repeated using POLYMERS 2 and 3. The results are shown in FIG. 3.

Figure 2:
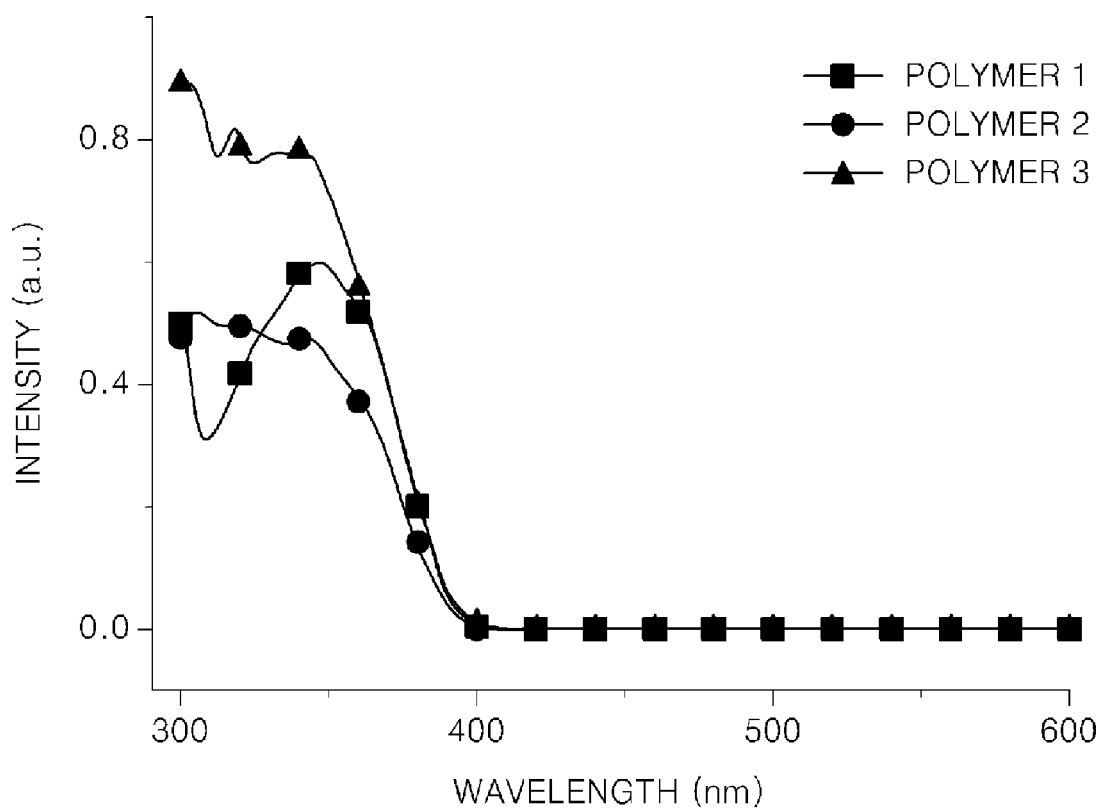
FIG. 2 is a graph illustrating ultraviolet ("UV") spectra (intensity vs. wavelength) of solutions of representative Polymers 1 to 3 prepared as described in Synthesis Examples 6 to 8, respectively.
Figure 3:
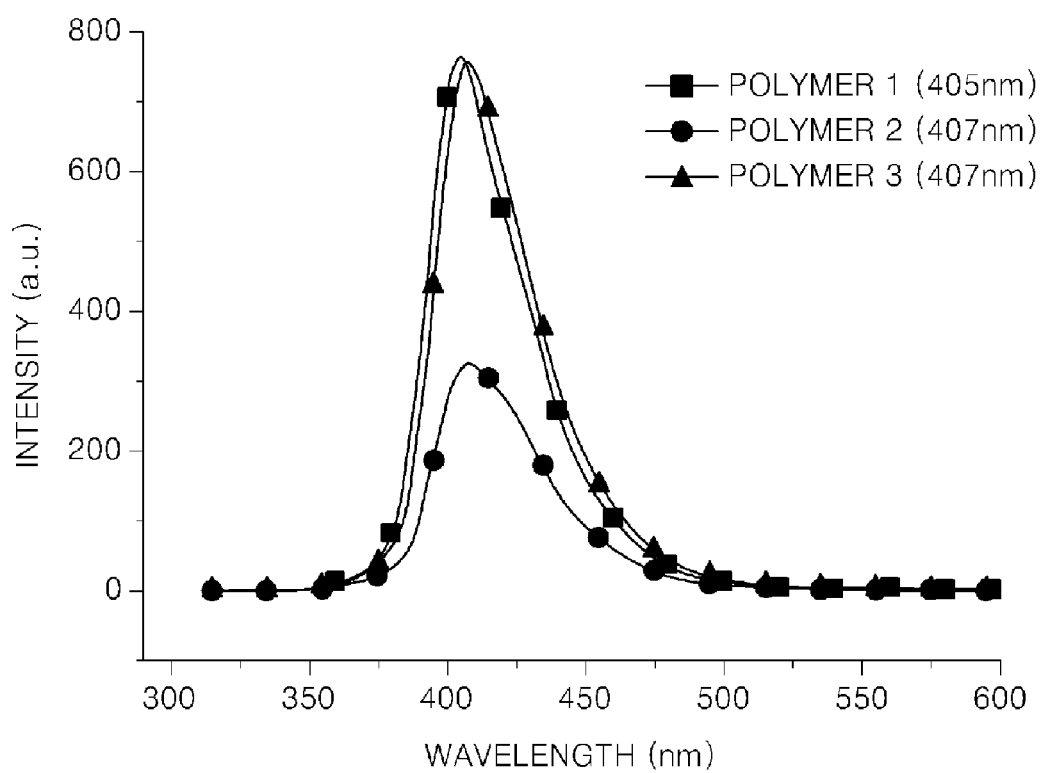
FIG. 3 is a graph illustrating photoluminescence ("PL") spectra (intensity vs. wavelength) of solutions of representative Polymers 1 to 3 prepared as described in Synthesis Examples 6 to 8, respectively.

Referring to FIGS. 2 and 3, the solutions of POLYMERS 1 to 3 had excellent light-emitting properties. Referring to FIG. 3, a maximum PL wavelength of POLYMER 1 was about 405 nm, and maximum PL wavelengths of POLYMERS 2 and 3 were about 407 nm.

Example 1

First, a transparent electrode substrate formed by coating a glass substrate with indium-tin oxide ("ITO") was cleaned. Then, the ITO layer was patterned into a desired pattern by using a photosensitive resin and an etchant, followed by cleaning. A HTL composition (Batron P 4083, available from Bayer AG) containing 3,4-ethylenedioxythiophene ("PEDOT") was coated on the ITO layer to a thickness of about 50 nm and baked at 200° C. for about 0.5 hours to form a HTL. An EML composition containing POLYMER 1 and 3 wt % of Ir(ppy)$_3$ in chlorobenzene was spin-coated on the HTL and baked at 180° C. for 30 minutes to form an EML containing POLYMER 1 and Ir(ppy)$_3$. The HTL composition and the EML composition were filtered using a 0.2 mm filter prior to the coating. The concentrations and coating rates of the HTL composition and the EML compositions were adjusted to form a HTL having a thickness of 50 nm and an EML having a thickness of 25 nm. TPBi was vacuum-deposited on the EML at a pressure of $4 \times 10^{-6}$ torr or less to form an ETL. Then, LiF and Al were sequentially deposited on the ETL to form an EIL having a thickness of 1 nm and a second electrode having a thickness of 100 nm, thereby manufacturing an OLED. The thickness and growth rate of each of the layers were adjusted using a crystal sensor during the deposition process.

Example 2

An OLED was manufactured in the same manner as in Example 1, except that POLYMER 2, instead of POLYMER 1, was used to form the EML.

Example 3

An OLED was manufactured in the same manner as in Example 1, except that POLYMER 3, instead of POLYMER 1, was used to form the EML.

Example 4

An OLED was manufactured in the same manner as in Example 3, except that the thickness of the EML was varied from 25 nm to 40 nm.

Example 5

An OLED was manufactured in the same manner as in Example 4, except that TAZ was vacuum-deposited between the EML and the ETL to further form a HBL having a thickness of 10 nm. The structures of the OLEDs of Examples 1 to 5 are summarized in Table 1 below:

Evaluation Example 2

Electroluminescence, efficiency, current density and luminance of each of the OLEDS of Examples 1 to 5 were evaluated using a PR650 Spectroscan Source Measurement Unit (available from PhotoResearch).

Figure 4:
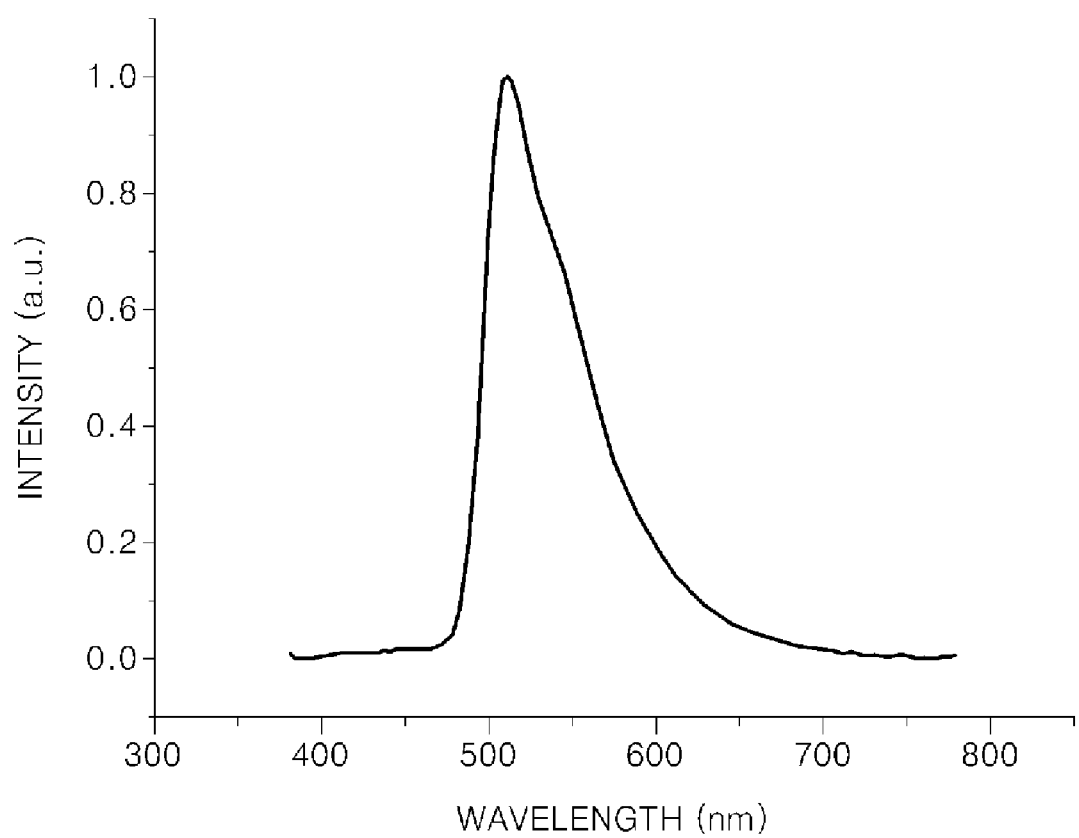
FIG. 4 is a graph of electroluminescence intensity of a representative OLED of Example 3 with respect to wavelength.

FIG. 4 is a graph of electroluminescence intensity of the OLED of Example 3 with respect to wavelength.

The OLED of Example 1 exhibited an efficiency of 10.1 cd/A at a driving voltage of 3.2 V, the OLED of Example 2 exhibited an efficiency of 12.7 cd/A at a driving voltage of 3.2 V and the OLED of Example 3 exhibited an efficiency of 18.4 cd/A at a driving voltage of 3.4 V (see Table 1).

Figure 5:
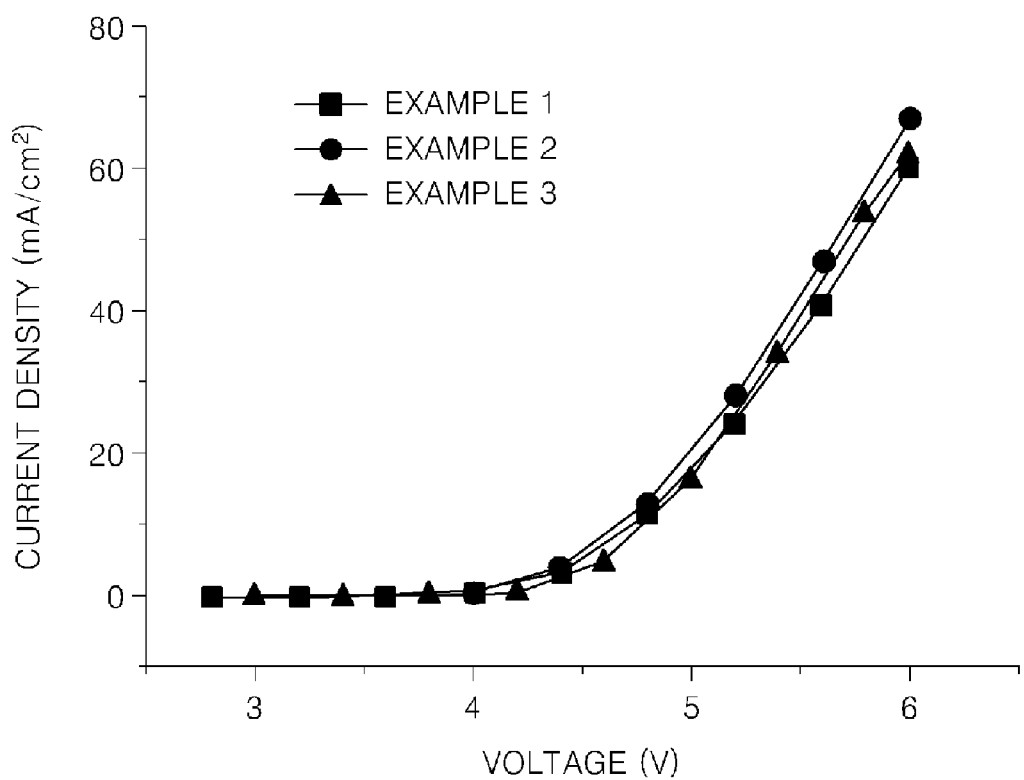
FIG. 5 is a graph of current densities of the representative OLEDs of Examples 1 to 3 with respect to voltage.
Figure 6:
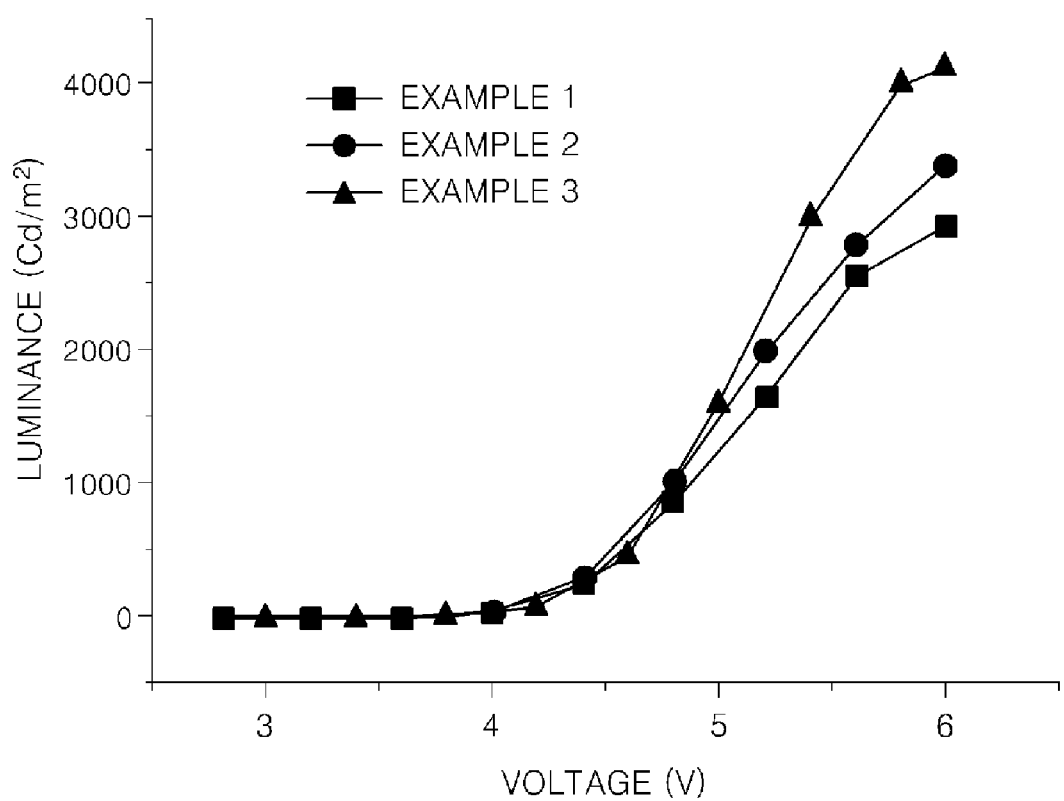
FIG. 6 is a graph of luminances of the representative OLEDs of Examples 1 to 3 with respect to voltage.

FIG. 5 is a graph of current densities of the OLEDs of Examples 1 to 3 with respect to voltage, and FIG. 6 is a graph of luminances of the OLEDs of Examples 1 to 3 with respect to voltage. Referring to FIG. 6, the OLED of Example 1 had a luminance of 2931 cd/m$^2$ at a driving voltage of 6 V, the OLED of Example 2 had a luminance of 3396 cd/m$^2$ at a driving voltage of 6 V and the OLED of Example 3 had a luminance of 4130 cd/m$^2$ at a driving voltage of 6 V.

Figure 7:
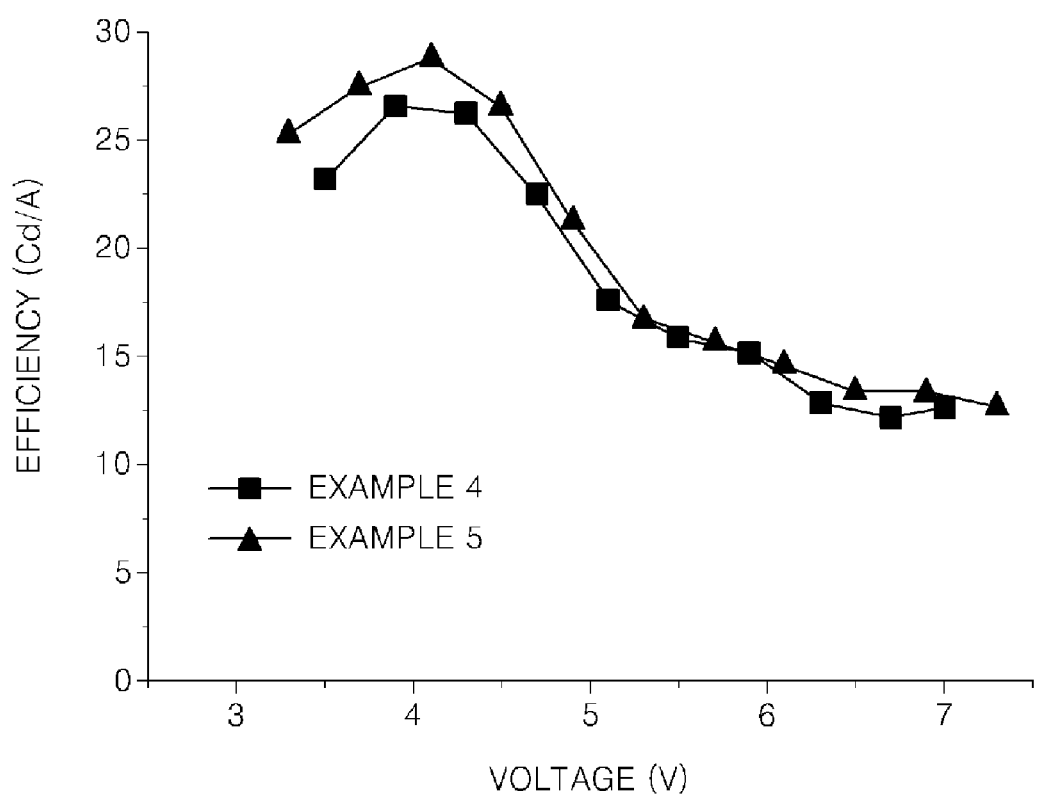
FIG. 7 is a graph of efficiencies of the representative OLEDs of Examples 4 and 5 with respect to voltage.

FIG. 7 is a graph of efficiencies of the OLEDs of Examples 4 and 5 with respect to voltage. Referring to FIG. 7, the OLED of Example 4 had an efficiency of 26.8 cd/A at a driving voltage of 4.0 V and the OLED of Example 5 had an efficiency of 28.8 cd/A at a driving voltage of 4.1 V.

The results presented in FIGS. 4 to 7 confirm that the OLEDs of Examples 1 to 5 exhibit excellent electrical characteristics.

As described above, according to the one or more of the above embodiments of the present invention, the polymer of Formula 1 above may transport both holes and electrons and have a high triplet state energy level. Therefore, an OLED including the polymer of Formula 1 may have a high efficiency, a high current density and a high luminance.

It should be understood that the exemplary embodiments described herein should be considered in a descriptive sense only and not for purposes of limitation. It should be understood that this disclosure is not limited to the disclosed embodiments, but, on the contrary, is intended to cover various modifications and equivalent arrangements included within the spirit and scope of the appended claims.

TABLE 1

| Example No. | Anode | HTL | EML | HBL | ETL | EIL/Cathode | Efficiency (cd/A) |
|---|---|---|---|---|---|---|---|
| 1 | ITO (150 nm) | PEDOT:PSS (50 nm) | POLYMER 1:Ir(ppy)$_3$ (3 wt %)[1] (25 nm) | — | TPBi (40 nm) | LiF(1 nm)/ Al(100 nm) | 10.1 (at 3.2 V) |
| 2 | ITO (150 nm) | PEDOT:PSS (50 nm) | POLYMER 2:Ir(ppy)$_3$ (3 wt %)[1] (25 nm) | — | TPBi (40 nm) | LiF(1 nm)/ Al(100 nm) | 12.7 (at 3.2 V) |
| 3 | ITO (150 nm) | PEDOT:PSS (50 nm) | POLYMER 3:Ir(ppy)$_3$ (3 wt %)[1] (25 nm) | — | TPBi (40 nm) | LiF(1 nm)/ Al(100 nm) | 18.4 (at 3.4 V) |
| 4 | ITO (150 nm) | PEDOT:PSS (50 nm) | POLYMER 3:Ir(ppy)$_3$ (3 wt %)[1] (40 nm) | — | TPBi (40 nm) | LiF(1 nm)/ Al(100 nm) | 26.8 (at 4.0 V) |
| 5 | ITO (150 nm) | PEDOT:PSS (50 nm) | POLYMER 3:Ir(ppy)$_3$ (3 wt %)[1] (40 nm) | TAZ (10 nm) | TPBi (40 nm) | LiF(1 nm)/ Al(100 nm) | 28.8 (at 4.1 V) |

[1]The amount of Ir(ppy)$_3$ based on 100 wt % of the EML.

What is claimed is:

1. A polymer comprising a polymeric unit represented by Formula 1 below:

Formula 1

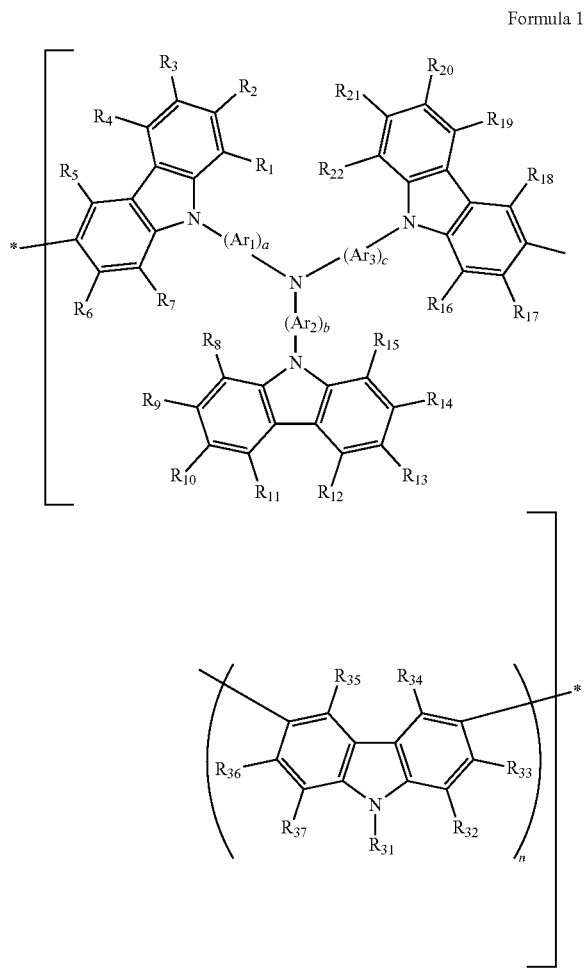

wherein, in Formula 1, each $Ar_1$, $Ar_2$ and $Ar_3$ is independently a substituted or unsubstituted $C_6$-$C_{30}$ arylene group or a substituted or unsubstituted $C_3$-$C_{30}$ heteroarylene group;

a, b and c are each independently an integer from 1 to 3;

each $Ar_1$ in —$(Ar_1)_a$— is identical to or different from any other $Ar_1$, b groups of —$Ar_2$— in —$(Ar_2)_b$— are identical to or different from each other and c groups of —$Ar_3$— in —$(Ar_3)_c$— are identical to or different from each other;

$R_1$ to $R_{22}$ and $R_{31}$ to $R_{37}$ are independently a hydrogen atom, a halogen atom, a hydroxyl group, an amino group, a cyano group, a carboxyl group, a substituted or unsubstituted $C_1$-$C_{30}$ alkyl group, a substituted or unsubstituted $C_2$-$C_{30}$ alkenyl group, a substituted or unsubstituted $C_2$-$C_{30}$ alkynyl group, a substituted or unsubstituted $C_1$-$C_{30}$ alkoxy group, a substituted or unsubstituted $C_6$-$C_{30}$ aryl group, a substituted or unsubstituted 3- to 30-membered heteroaryl group, a group represented by —$N(Q_1)(Q_2)$ or a group represented by —$Si(Q_3)(Q_4)(Q_5)$, wherein $Q_1$ to $Q_5$ are each independently a hydrogen atom, a halogen atom, a hydroxyl group, an amino group, a cyano group, a carboxyl group, a substituted or unsubstituted $C_1$-$C_{30}$ alkyl group, a substituted or unsubstituted $C_2$-$C_{30}$ alkenyl group, a substituted or unsubstituted $C_2$-$C_{30}$ alkynyl group, a substituted or unsubstituted $C_1$-$C_{30}$ alkoxy group, a substituted or unsubstituted $C_6$-$C_{30}$ aryl group or a substituted or unsubstituted $C_3$-$C_{30}$ heteroaryl group;

n is an integer from 0 to 5; and each "*" indicates a point of attachment to an identical or a different polymeric unit.

2. The polymer of claim 1, wherein each $Ar_1$ to $Ar_3$ is independently a substituted or unsubstituted phenylene group, a substituted or unsubstituted pentacenylene group, a substituted or unsubstituted indenylene group, a substituted or unsubstituted naphthylene group, a substituted or unsubstituted azulenylene group, a substituted or unsubstituted heptalenylene group, a substituted or unsubstituted indacenylene group, a substituted or unsubstituted acenaphthylene group, a substituted or unsubstituted fluorenylene group, a substituted or unsubstituted phenalenylene group, a substituted or unsubstituted phenanthrenylene group, a substituted or unsubstituted anthracenylene group, a substituted or unsubstituted fluoranthenylene group, a substituted or unsubstituted triphenylenylene group, a substituted or unsubstituted pyrenylenylene group, a substituted or unsubstituted chrysenylene group, a substituted or unsubstituted naphthacenylene group, a substituted or unsubstituted picenylene group, a substituted or unsubstituted perylenylene group, a substituted or unsubstituted pentaphenylene group, a substituted or unsubstituted hexacenylene group, a substituted or unsubstituted pyrrolylene group, a substituted or unsubstituted pyrazolylene group, a substituted or unsubstituted imidazolylene group, a substituted or unsubstituted imidazolinylene group, a substituted or unsubstituted imidazopyridinylene group, a substituted or unsubstituted imidazopyrimidinylene group, a substituted or unsubstituted pyridinylene group, a substituted or unsubstituted pyrazinylene group, a substituted or unsubstituted pyrimidinylene group, a substituted or unsubstituted indolylene group, a substituted or unsubstituted purinylene group, a substituted or unsubstituted quinolinylene group, a substituted or unsubstituted phthalazinylene group, a substituted or unsubstituted indolizinylene group, a substituted or unsubstituted naphthyridinylene group, a substituted or unsubstituted quinazolinylene group, a substituted or unsubstituted cinnolinylene group, a substituted or unsubstituted indazolylene group, a substituted or unsubstituted carbazolylene group, a substituted or unsubstituted phenazinylene group, a substituted or unsubstituted phenanthridinylene group, a substituted or unsubstituted pyranylene group, a substituted or unsubstituted chromenylene group, a substituted or unsubstituted benzofuranylene group, a substituted or unsubstituted thiophenylene group, a substituted or unsubstituted benzothiopheylene group, a substituted or unsubstituted isothiazolylene group, a substituted or unsubstituted benzoimidazolylene group or a substituted or unsubstituted isoxazolylene group.

3. The polymer of claim 1, wherein $Ar_1$, $Ar_2$ and $Ar_3$ are each independently a phenylene group, a $C_1$-$C_{10}$ alkylphenylene group, a di($C_1$-$C_{10}$ alkyl)phenylene group, a ($C_6$-$C_{14}$ aryl)phenylene group, a di($C_6$-$C_{14}$ aryl)phenylene group, a carbazolylene group, a $C_1$-$C_{10}$ alkylcarbazolylene group, a di($C_1$-$C_{10}$ alkyl)carbazolylene group, a $C_6$-$C_{14}$ arylcarbazolylene group, a di($C_6$-$C_{14}$ aryl)carbazolylene group, a fluorenylene group, a $C_1$-$C_{10}$ alkylfluorenylene group, a di($C_1$-$C_{10}$ alkyl)fluorenylene group, a ($C_6$-$C_{14}$ aryl)fluorenylene group, a di($C_6$-$C_{14}$ aryl)fluorenylene group, a naphthylene group, a $C_1$-$C_{10}$ alkylnaphthalene group, a di($C_1$-$C_{10}$ alkyl) naphthylene group, a ($C_6$-$C_{14}$ aryl)naphthylene group, a di($C_6$-$C_{14}$ aryl)naphthylene group, an anthrylene group, a $C_1$-$C_{10}$ alkylanthrylene group, a di($C_1$-$C_{10}$ alkyl)anthrylene group, a ($C_6$-$C_{14}$ aryl)anthrylene group, a di($C_6$-$C_{14}$ aryl)anthrylene group, a pyridinylene group, a $C_1$-$C_{10}$ alkylpyridinylene group, a di($C_1$-$C_{10}$ alkyl)pyridinylene group, a ($C_6$-$C_{14}$ aryl)pyridinylene group, a di($C_6$-$C_{14}$ aryl)pyridinylene group, a quinolinylene group, a $C_1$-$C_{10}$ alkylquinolinylene group, a di($C_1$-$C_{10}$ alkyl)quinolinylene group, a ($C_6$-$C_{14}$ aryl)quinolinylene group, a di($C_6$-$C_{14}$ aryl)quinolinylene group, a benzoimidazolylene group, a $C_1$-$C_{10}$ alkylbenzoimidazolylene group, a di($C_1$-$C_{10}$ alkyl)benzoimidazolylene group, a ($C_6$-$C_{14}$ aryl)benzoimidazolylene group, a di($C_6$-$C_{14}$ aryl)benzoimidazolylene group, an imidazopyridinylene group, a $C_1$-$C_{10}$ alkylimidazopyridinylene group, a di($C_1$-$C_{10}$ alkyl)imidazopyridinylene group, a ($C_6$-$C_{14}$ aryl)imidazopyridinylene group, a di($C_6$-$C_{14}$ aryl)imidazopyridinylene group, an imidazopyrimidinylene group, a $C_1$-$C_{10}$ alkylimidazopyrimidinylene group, a di($C_1$-$C_{10}$ alkyl) imidazopyrimidinylene group, a ($C_6$-$C_{14}$ aryl)imidazopyrimidinylene group or a di ($C_6$-$C_{14}$ aryl)imidazopyrimidinylene group.

4. The polymer of claim 1, wherein a, b and c are each independently 1, 2 or 3.

5. The polymer of claim 1, wherein, in Formula 1, —(Ar$_1$)$_a$—, —(Ar$_2$)$_b$— and —(Ar$_3$)$_c$— are each independently represented by one of Formulae 2A to 2K below:

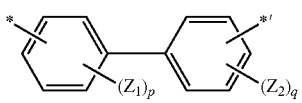

Formula 2A

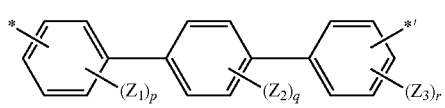

Formula 2B

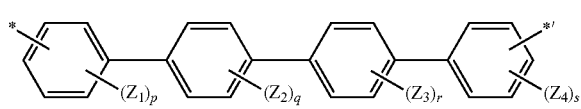

Formula 2C

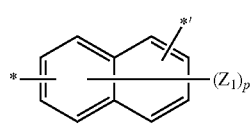

Formula 2D

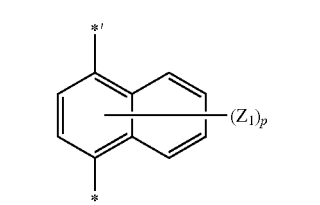

Formula 2E

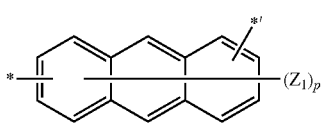

Formula 2F

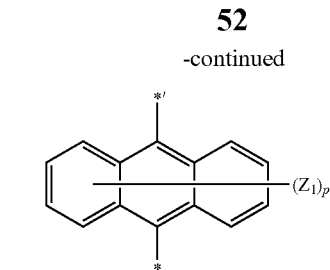

Formula 2G

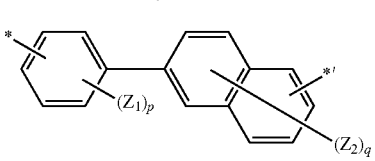

Formula 2H

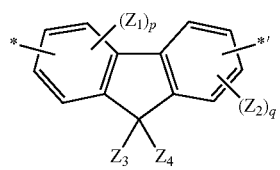

Formula 2I

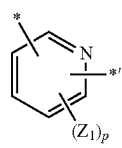

Formula 2J

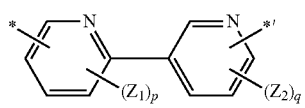

Formula 2K wherein, in Formulae 2A to 2K,
$Z_1$ to $Z_4$ are each independently a hydrogen atom, a $C_1$-$C_{10}$ alkyl group or a $C_6$-$C_{14}$ aryl group;
p, q, r and s are each independently an integer from 1 to 8;
* indicates a binding site to the N in Formula 1 that is bound to —(Ar$_1$)$_a$—, —(Ar$_2$)$_b$— and —(Ar$_3$)$_c$—; and
*' indicates a binding site to the N of a carbazole ring in Formula 1.

6. The polymer of claim 1, wherein $R_1$ to $R_{22}$ and $R_{31}$ to $R_{37}$ are each independently a hydrogen atom, a halogen atom, a hydroxyl group, an amino group, a cyano group, a carboxyl group, a substituted or unsubstituted $C_1$-$C_{10}$ alkyl group, a substituted or unsubstituted $C_2$-$C_{10}$ alkenyl group, a substituted or unsubstituted $C_2$-$C_{10}$ alkynyl group, a substituted or unsubstituted $C_1$-$C_{10}$ alkoxy group, a substituted or unsubstituted $C_6$-$C_{14}$ aryl group or a substituted or unsubstituted 3- to 14-membered heteroaryl group.

7. The polymer of claim 1, wherein $R_1$ to $R_9$, $R_{11}$, $R_{12}$, $R_{14}$ to $R_{22}$ and $R_{32}$ to $R_{37}$ are each a hydrogen atom; and $R_{10}$, $R_{13}$ and $R_{31}$ are each independently a hydrogen atom, a halogen atom, a hydroxyl group, an amino group, a cyano group, a carboxyl group, a substituted or unsubstituted $C_1$-$C_{30}$ alkyl group, a substituted or unsubstituted $C_2$-$C_{30}$ alkenyl group, a substituted or unsubstituted $C_2$-$C_{30}$ alkynyl group, a substituted or unsubstituted $C_1$-$C_{30}$ alkoxy group, a substituted or unsubstituted $C_6$-$C_{30}$ aryl group, a substituted or unsubstituted $C_3$-$C_{30}$ heteroaryl group, a group represented by —N(Q$_1$)(Q$_2$) or a group represented by —Si(Q$_3$)(Q$_4$)(Q$_5$), wherein Q$_1$ to Q$_5$ are each independently a hydrogen atom, a halogen atom, a hydroxyl group, an amino group, a cyano group, a carboxyl group, a substituted or unsubstituted $C_1$-$C_{30}$ alkyl group, a substituted or unsubstituted $C_2$-$C_{30}$ alkenyl group, a substituted or unsubstituted $C_2$-$C_{30}$ alkynyl group, a substituted or unsubstituted $C_1$-$C_{30}$ alkoxy group, a substituted or unsubstituted $C_6$-$C_{30}$ aryl group or a substituted or unsubstituted $C_3$-$C_{30}$ heteroaryl group.

8. The polymer of claim 1, wherein $R_1$ to $R_9$, $R_{11}$, $R_{12}$, $R_{14}$ to $R_{22}$ and $R_{32}$ to $R_{37}$ are each a hydrogen atom; and $R_{10}$, $R_{13}$ and $R_{31}$ are each independently a hydrogen atom, a halogen atom, a hydroxyl group, an amino group, a cyano group, a carboxyl group, a $C_1$-$C_{10}$ alkyl group, a $C_1$-$C_{10}$ alkoxy group, a $C_6$-$C_{14}$ aryl group or a 3- to 14-membered heteroaryl group.

9. The polymer of claim 1, wherein n is 0, 1 or 2.

10. The polymer of claim 1, wherein the polymeric unit is represented by one of Formulae 1A, 1B and 1C below:

Formula 1A

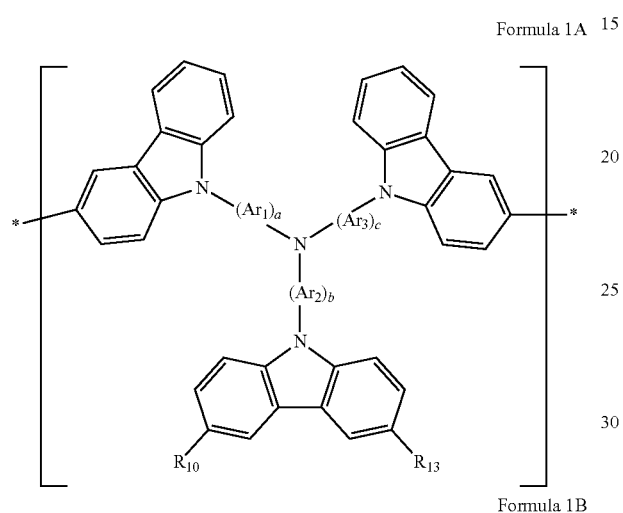

Formula 1B

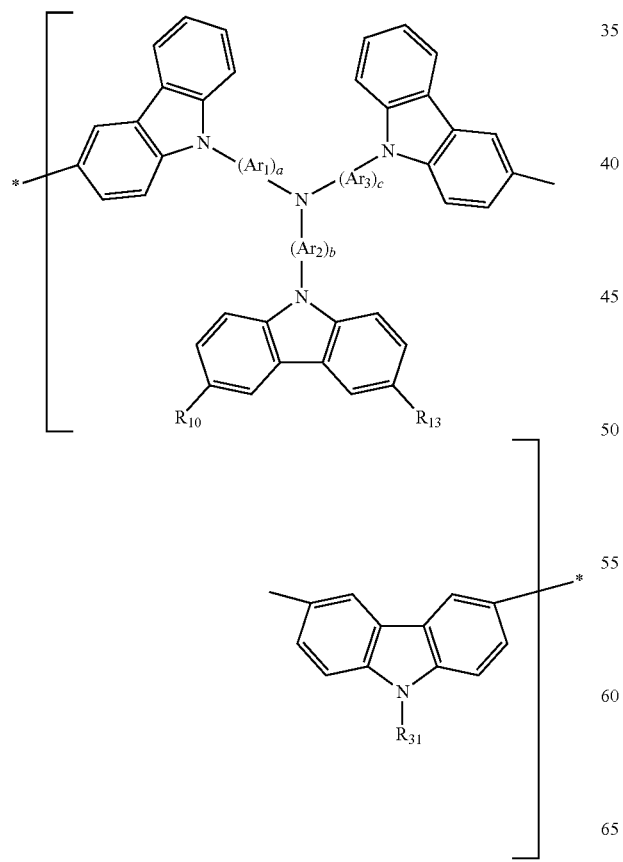

Formula 1C

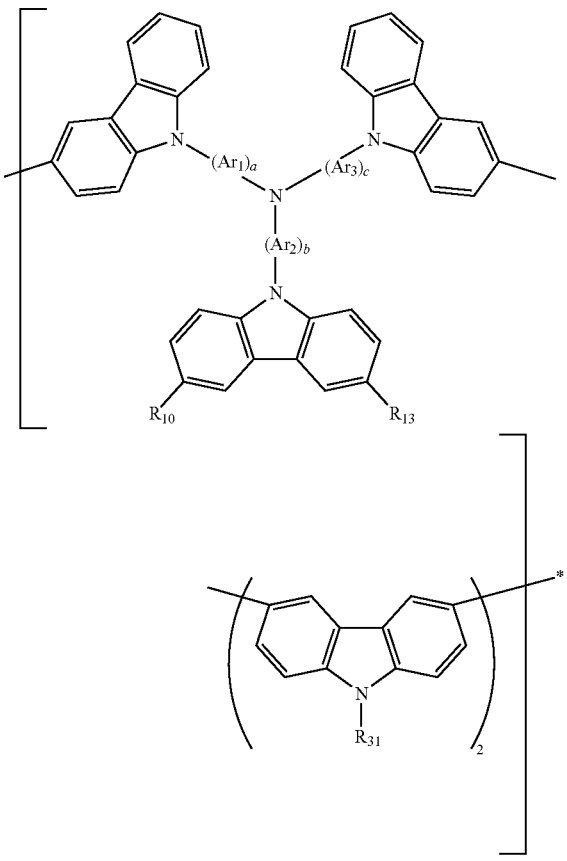

wherein, in Formulae 1A to 1C,
each $Ar_1$, $Ar_2$ and $Ar_3$ is independently a substituted or unsubstituted $C_6$-$C_{30}$ arylene group or a substituted or unsubstituted $C_3$-$C_{30}$ heteroarylene group;
a, b and c are each independently 1, 2 or 3;
each $Ar_1$ in —$(Ar_1)_a$— is identical to or different from any other $Ar_1$, each $Ar_2$ in —$(Ar_2)_b$— is identical to or different from any other $Ar_2$ and each $Ar_3$ in —$(Ar_3)_c$— is identical to or different from any other $Ar_3$;
$R_{10}$, $R_{13}$ and $R_{31}$ are each independently a hydrogen atom, a halogen atom, a hydroxyl group, an amino group, a cyano group, a carboxyl group, a substituted or unsubstituted $C_1$-$C_{30}$ alkyl group, a substituted or unsubstituted $C_2$-$C_{30}$ alkenyl group, a substituted or unsubstituted $C_2$-$C_{30}$ alkynyl group, a substituted or unsubstituted $C_1$-$C_{30}$ alkoxy group, a substituted or unsubstituted $C_6$-$C_{30}$ aryl group, a substituted or unsubstituted $C_3$-$C_{30}$ heteroaryl group, a group represented by —N($Q_1$)($Q_2$) or a group represented by —Si($Q_3$)($Q_4$)($Q_5$), wherein $Q_1$ to $Q_5$ are each independently a hydrogen atom, a halogen atom, a hydroxyl group, an amino group, a cyano group, a carboxyl group, a substituted or unsubstituted $C_1$-$C_{30}$ alkyl group, a substituted or unsubstituted $C_2$-$C_{30}$ alkenyl group, a substituted or unsubstituted $C_2$-$C_{30}$ alkynyl group, a substituted or unsubstituted $C_1$-$C_{30}$ alkoxy group, a substituted or unsubstituted $C_6$-$C_{30}$ aryl group or a substituted or unsubstituted $C_3$-$C_{30}$ heteroaryl group.

11. The polymer of claim 10, wherein, in Formulae 1A to 1C, —$(Ar_1)_a$—, —$(Ar_2)_b$— and —$(Ar_3)_c$— are each independently represented by one of Formulae 2A to 2K below:

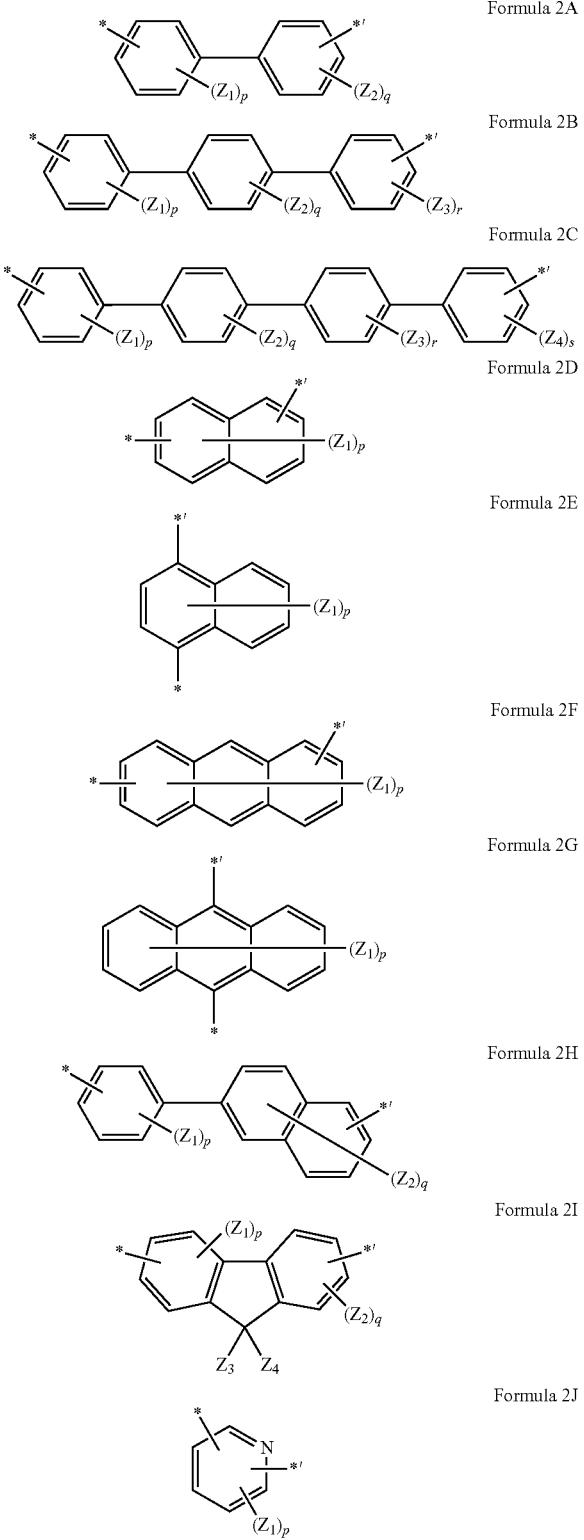

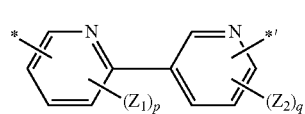

wherein in Formulae 2A to 2K, $Z_1$ to $Z_4$ are each independently a hydrogen atom, a $C_1$-$C_{10}$ alkyl group or a $C_6$-$C_{14}$ aryl group; p, q, r and s are each independently an integer from 1 to 8; * indicates a binding site to the N in Formula 1 that is bound to —$(Ar_1)_a$—, —$(Ar_2)_b$— and —$(Ar_3)_c$—; and *' indicates a binding site to the N of a carbazole ring in Formula 1.

12. The polymer of claim 10, wherein, in Formulae 1A to 1C, $R_{10}$, $R_{13}$ and $R_{31}$ are each independently a hydrogen atom, a halogen atom, a hydroxyl group, an amino group, a cyano group, a carboxyl group, a $C_1$-$C_{10}$ alkyl group, a $C_1$-$C_{10}$ alkoxy group, a $C_6$-$C_{14}$ aryl group or a 3- to 14-membered heteroaryl group.

13. The polymer of claim 10, wherein, in Formulae 1A to 1C, $R_{10}$, $R_{13}$ and $R_{31}$ are each independently a hydrogen atom, a methyl group, an ethyl group, a linear or branched propyl group, a linear or branched butyl group, a linear or branched pentyl group, a linear or branched hexyl group, a linear or branched heptyl group or a linear or branched octyl group.

14. The polymer of claim 1, having a weight average molecular weight of about 2,000 to about 1,000,000.

15. The polymer of claim 1, wherein the polymer has bipolar characteristics and is suitable for use as a phosphorescent host.

16. An organic light-emitting device comprising:
a substrate;
a first electrode;
a second electrode; and
a first layer disposed between the first electrode and the second electrode, the first layer comprising the polymer of claim 1.

17. The organic light-emitting device of claim 16, wherein the first layer is an emission layer and further comprises a phosphorescent dopant.

18. The organic light-emitting device of claim 17, wherein the phosphorescent dopant comprises an organometallic complex including at least one metal selected from iridium (Ir), platinum (Pt), osmium (Os), rhenium (Re), titanium (Ti), zirconium (Zr), hafnium (Hf) and combinations of at least two of the foregoing.

19. The organic light-emitting device of claim 17, wherein the amount of the phosphorescent dopant in the first layer is in the range of about 1 wt % to about 10 wt % based on a total weight of the first layer.

20. The organic light-emitting device of claim 16, further comprising, between the first electrode and the second electrode, at least one layer selected from a hole injection layer, a hole transport layer, an emission layer, a hole blocking layer, an electron transport layer and an electron injection layer.

* * * * *